United States Patent
Ouellette et al.

(10) Patent No.: US 10,943,950 B2
(45) Date of Patent: Mar. 9, 2021

(54) MAGNETIC MEMORY DEVICES WITH ENHANCED TUNNEL MAGNETORESISTANCE RATIO (TMR) AND METHODS OF FABRICATION

(71) Applicant: Intel Corporation, Santa Clara, CA (US)

(72) Inventors: Daniel Ouellette, Portland, OR (US); Christopher Wiegand, Portland, OR (US); Justin Brockman, Portland, OR (US); Tofizur Rahman, Portland, OR (US); Oleg Golonzka, Beaverton, OR (US); Angeline Smith, Hillsboro, OR (US); Andrew Smith, Hillsboro, OR (US); James Pellegren, Portland, OR (US); Aaron Littlejohn, Portland, OR (US); Michael Robinson, Beaverton, OR (US); Huiying Liu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/367,126

(22) Filed: Mar. 27, 2019

(65) Prior Publication Data

US 2020/0312907 A1 Oct. 1, 2020

(51) Int. Cl.
*H01L 27/22* (2006.01)
*H01L 43/02* (2006.01)
*H01L 43/10* (2006.01)
*H01L 43/12* (2006.01)
*H01F 10/32* (2006.01)
(Continued)

(52) U.S. Cl.
CPC .......... *H01L 27/228* (2013.01); *G11C 11/161* (2013.01); *H01F 10/329* (2013.01); *H01F 10/3254* (2013.01); *H01F 10/3268* (2013.01); *H01F 10/3286* (2013.01); *H01F 41/34* (2013.01); *H01L 43/02* (2013.01); *H01L 43/10* (2013.01); *H01L 43/12* (2013.01)

(58) Field of Classification Search
CPC ....... H01L 27/228; H01L 43/02; H01L 43/10; H01L 43/12; H01F 10/3254; H01F 10/3268; H01F 10/3286; H01F 10/329
See application file for complete search history.

(56) References Cited

U.S. PATENT DOCUMENTS

2007/0063237 A1* 3/2007 Huai .................... G11B 5/3983
257/295
2019/0088713 A1* 3/2019 Swerts .................... H01L 43/10
(Continued)

*Primary Examiner* — Christine A Enad
(74) *Attorney, Agent, or Firm* — Green, Howard & Mughal LLP

(57) ABSTRACT

A memory device includes a first electrode, a conductive layer including iridium above the first electrode, a magnetic junction on the conductive layer and a second electrode above the magnetic junction. The magnetic junction includes a magnetic structure including a first magnetic layer including cobalt, a non-magnetic layer including platinum or tungsten on the first magnetic layer and a second magnetic layer including cobalt on the non-magnetic layer. The magnetic junction further includes an anti-ferromagnetic layer on the magnet structure, a fixed magnet above the anti-ferromagnetic layer, a free magnet above the fixed magnet and a tunnel barrier between the fixed magnet and the free magnet.

20 Claims, 13 Drawing Sheets

(51) Int. Cl.
*H01F 41/34* (2006.01)
*G11C 11/16* (2006.01)

(56) References Cited

U.S. PATENT DOCUMENTS

| | | | | |
|---|---|---|---|---|
| 2019/0259810 A1* | 8/2019 | Jacob | .................... | H01L 27/228 |
| 2019/0305210 A1* | 10/2019 | Tahmasebi | .............. | H01L 43/02 |
| 2019/0374947 A1* | 12/2019 | Shrivastava | .......... | B01L 3/5027 |
| 2020/0011943 A1* | 1/2020 | Zimmer | .................. | H01L 43/10 |

* cited by examiner

US 10,943,950 B2

MAGNETIC MEMORY DEVICES WITH ENHANCED TUNNEL MAGNETORESISTANCE RATIO (TMR) AND METHODS OF FABRICATION

BACKGROUND

For the past several decades, feature size reduction has been a key focus for industrial-scale semiconductor process development. Scaling to smaller dimensions enables a higher density of functional elements per chip, smaller chips, and also reduced cost. However, as the industry approaches the physical limits of traditional scaling, it is becoming increasingly important to look for non-traditional types of devices that can offer new functionality. One such example is non-volatile memory based on a perpendicular magnetic tunnel junction (pMTJ).

Non-volatile embedded memory device with pMTJ, e.g., on-chip embedded memory with non-volatility can enable energy and computational efficiency. However, the technical challenges of assembling a pMTJ stack to form functional devices present formidable roadblocks to commercialization of this technology today. Specifically, enhancing the perpendicular magnetic anisotropy in a pinning magnetic layer that couples with reference magnetic layers is one of the challenges in assembling a viable pMTJ stack.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
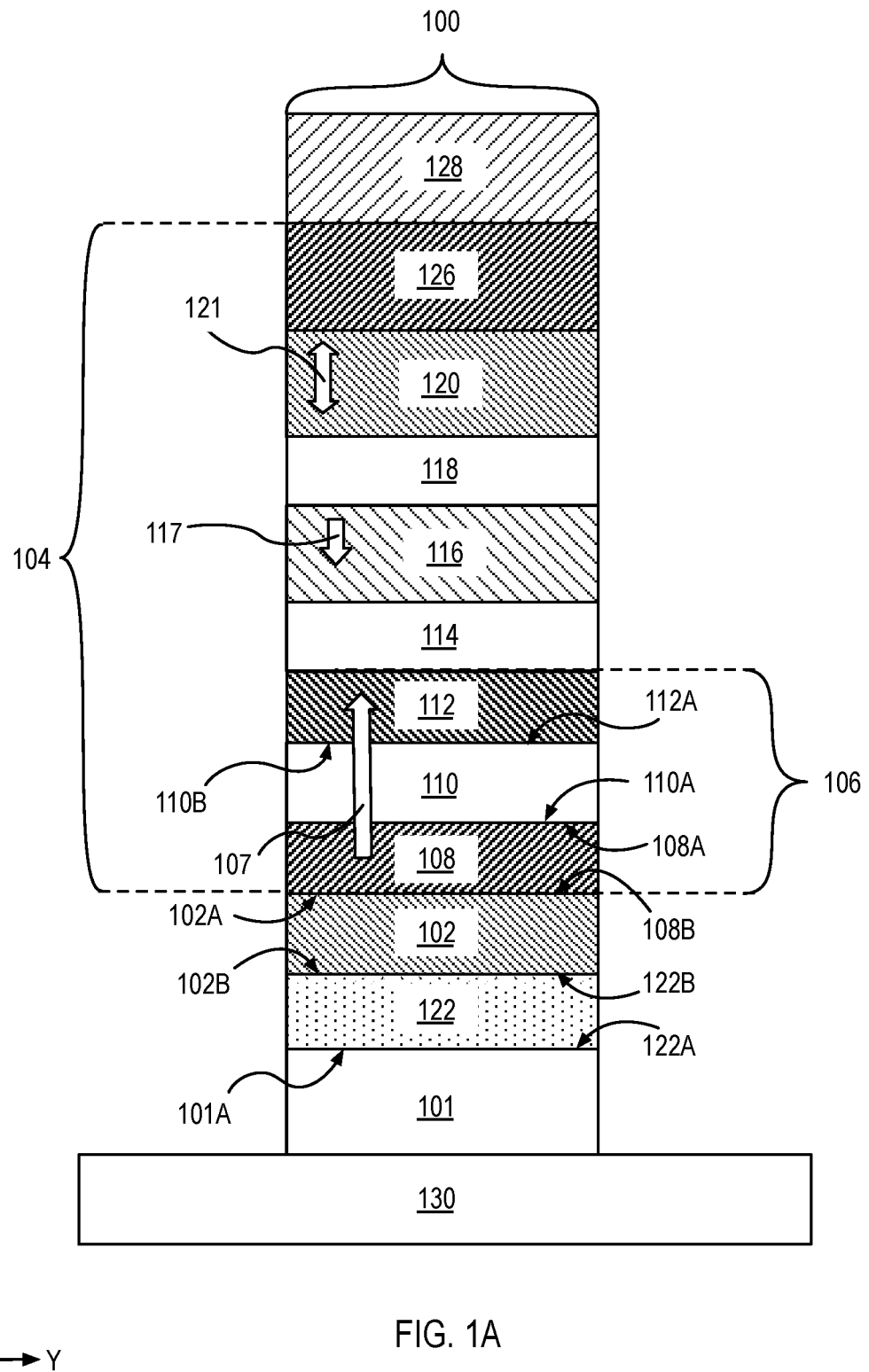
FIG. 1A illustrates a cross-sectional view of a memory device, in accordance with an embodiment of the present disclosure.

Perpendicular-MTJ (pMTJ) devices with enhanced tunnel magnetoresistance ratio factor and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque,).

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

An MTJ device functions as a memory device where the resistance of the MTJ device switches between a high resistance state and a low resistance state. The resistance state of an MTJ device is defined by the relative orientation of magnetizations between a free magnet and a fixed magnet that is separated from the free magnet by a tunnel barrier. When magnetizations of the free magnet and the fixed magnet have orientations that are in the same direction, the MTJ device is said to be in a low resistance state. Conversely, when the magnetization of the free magnet and the magnetization of the fixed magnet are oriented in an opposite direction to each other, the MTJ device is said to be in a high resistance state.

As MTJ devices are scaled, the need for smaller memory elements to fit into a scaled cell size has driven the industry in the direction of perpendicular MTJ (pMTJ). pMTJ based memory devices have a fixed magnet and a free magnet each having a magnetic anisotropy that is perpendicular with respect to a horizontal plane of the free magnet. Resistance switching is brought about in a pMTJ device by passing a threshold spin polarized current through the pMTJ device. The spin polarized current can influence the orientation of magnetization in the free magnet, and and align the magnetization with or against the magnetization of the fixed magnet. Influencing the magnetization in the free magnet is brought about by a phenomenon known as spin torque transfer, where torque from the spin polarized current (from fixed magnet) is imparted to the magnetization of the free magnet. By changing the direction of the spin polarized current through the pMTJ, the direction of magnetization in the free magnet may be reversed relative to the direction of magnetization in the fixed magnet. Since the free magnet does not need a constant source of spin polarized current to maintain a magnetization direction, the resistance state of the pMTJ device is retained even when no current flows through the pMTJ device. For this reason, the pMTJ device belongs to a class of memory known as non-volatile memory.

Because a fixed magnet provides for a spin polarized current and has a magnetization that remains in a fixed orientation there are challenges for selecting materials for the fixed magnet. Typical materials for fixed magnet include cobalt, iron and boron. However, preventing un-intentional changes in magnetization is challenging especially when the fixed magnet is a perpendicular fixed magnet and includes iron. Un-intentional changes in magnetization can result, for example, from diffusion of iron from the fixed magnet. Diffusion of iron from the fixed magnet weakens perpendicular magnetic anisotropy (PMA) which is a source of magnetization in the fixed magnet. Stabilizing and improving PMA can help increase process margins for bit yield, allow for a higher coercivity switching layer, and provide robustness against loss of switching efficiency. Switching efficiency may be defined as the magnitude and duration of switching voltage or current pulse required to write a memory bit with a given tunnel barrier electrical resistance and with a given thermal stability. Switching efficiency may depend on polarity of switching voltage.

During device operation, a write operation reverses the magnetization in the free layer by spin transfer torque effect. In response there is a back torque on the fixed magnet from the free magnet. A fixed magnet that is sufficiently stable, does not cant or possibly reverse magnetization direction due to back-torque. However, in an absence of a sufficiently stable fixed magnet a greater spin polarized current is required to switch the free layer. An increase in spin polarized current translates to loss of efficiency in device operation as a larger voltage is required to generate a larger spin polarized current (for a given spin polarization).

Stability in magnetization of a fixed can also be improved by coupling the fixed magnet with a pinning magnet structure. The pinning structure is also provided in a memory device to counteract a back-torque effect described above. A pinning structure typically includes platinum and a magnetic material to provide (PMA). The pinning structure can include, for example, a multilayer stack having alternating layers of platinum and magnetic material such as cobalt to provide PMA. However, when the fixed magnet includes iron, iron can diffuse into the pining structure through an intermediate coupling layer between the fixed magnet and the pinning structure. Likewise, platinum may also diffuse through the coupling layer into the fixed magnet. A diffusion process can be enhanced when the memory device is annealed at high temperatures, such as temperatures above 350 degrees Celsius. A high anneal temperature is desirable for providing a greater process margin for back end of the line (BEOL) processing in semiconductor device fabrication. Higher anneal temperatures can also improve crystallization of switching and fixed magnet layers, leading to better performance (TMR, efficiency, retention).

However, diffusion during high temperature anneal can render memory devices functionless due to degradation in data retention. It is desirable to minimize inter-diffusion (of iron into regions including platinum and vice versa) at even higher temperatures such as temperatures at or above 400 degrees Celsius during certain BEOL processing operations. The inventors have observed that anneal at temperature at or above 400 degrees Celsius reduces switching efficiency in memory devices. Reduction in switching efficiency is consistent with PMA degradation in fixed and pinning layer.

The inventors have found that implementing a single layer of conductive material such as platinum between two magnetic layers in a pinning structure can reduce the effective volume of platinum in the pinning structure compared to a total volume of platinum in a multilayer stack described above. Reduction in volume of platinum may be beneficial because it limits an effective amount of platinum that can diffuse from the pinning layer into a nearby fixed magnet and also presents a limited volume for iron to diffuse into from a nearby fixed magnet. A platinum pinning layer with a reduced thickness causes less degradation in fixed and pinning layer PMA at higher anneal temperature.

A reduction in volume of platinum is also found to directly correlate to an increase in tunneling magnetoresistance (TMR) ratio which is suggestive of an improvement in magnetic anisotropy in the fixed and pinning structure. TMR ratio is a property of an MTJ that quantifies a ratio of the difference between a high and a low electrical resistance state in a MTJ to a low resistance state expressed in percent. In general, a TMR ratio number greater than 100% is considered to be high. A high TMR ratio denotes that an MTJ can achieve a greater electrical resistance difference (between high level and low level) thus, enabling a large collection of MTJ devices to be operated in memory array without undergoing erroneous switching.

In some embodiments, platinum has been replaced altogether by introducing tungsten between two magnetic layers in a pining structure without adversely impacting TMR. Diffusion of iron from the fixed magnet to pinning structure is found to be lower when tungsten is implemented instead of platinum.

In various embodiments, the pinning structure is directly on a conductive layer (between an electrode and the pinning structure) that has a crystal texture which promotes high quality FCC <111> crystal texture in the pining structure and subsequently in the fixed magnetic layer. A conductive layer that promotes a high-quality FCC <111> crystal texture in fixed magnetic layer can enhance perpendicular magnetic anisotropy (PMA) of the fixed magnetic layer.

The conductive layer can include a material such as iridium that has a FCC <111> crystal texture. The inventors have found that implementing a conductive layer including iridium and a pinning layer including a single thin (4 Angstroms or less) layer of platinum for example, may reduce iron diffusion from the fixed magnet into the conductive layer by a factor of three. Other benefits of iridium intermediate layer include having a sufficient thickness to be continuous and providing a texture having a FCC <111> crystal structure for growth of a FCC magnetic layer immediately above. The presence of iridium at an interface between a magnetic layer in the pinning structure is a source of PMA. The PMA is enhanced because iridium has a FCC <111> crystal structure and is substantially lattice matched with magnetic materials in a lowermost portion of the pinning structure. In some embodiments the intermediate layer including iridium and having a FCC <111> crystal structure is directly adjacent to a layer of cobalt having a FCC <111> crystal structure in the pinning structure.

In some embodiments, the pinning structure may include a first bilayer stack, having a layer of tungsten on a layer of magnetic material, on a second bilayer stack having a layer of platinum on a layer of magnetic material. The first bilayer stack may be capped by a magnetic material. Such a pinning structure may utilize platinum to provide improved PMA and utilize tungsten as an effective barrier against iron or platinum diffusion.

In a third embodiment, the pining structure may include a single layer of a magnet instead of a multilayer stack.

In accordance with embodiments of the present disclosure, a memory device includes a first electrode, a conductive layer including iridium above the first electrode and a magnetic junction on the conductive layer. In an embodiment, the magnetic junction includes a magnetic structure having a first magnetic layer including cobalt, a non-magnetic layer on the first magnetic layer and a second magnetic layer including cobalt on the non-magnetic layer. The magnetic junction further includes an anti-ferromagnetic coupling layer on the magnet structure a fixed magnet above the anti-ferromagnetic coupling layer, a layer including a metal and oxygen on the fixed magnet. In an embodiment, the magnetic junction is a perpendicular magnetic tunnel junction, and the layer is a tunnel barrier layer. The tunnel barrier layer has an <001> crystal texture. For improving TMR ratio, the tunnel barrier and the second magnet are highly crystal matched. The magnetic tunnel junction further includes a free magnet on the tunnel barrier layer. The free magnet has a magnetization which can change in response to torque from a current tunneling through the tunnel barrier layer. The memory device further includes a second electrode above the magnetic junction.

FIG. 1A is an illustration of a cross-sectional view of a memory device 100 in accordance with an embodiment of the present disclosure. The memory device 100 includes a first electrode 101, a conductive layer 102 including iridium above the first electrode 101 and a magnetic tunnel junction (MTJ) 104 on the conductive layer 102. The MTJ 104 includes a magnetic structure 106, having a collective magnetization 107. In an embodiment, the magnetic structure 106 includes a first magnetic layer 108 including cobalt, a non-magnetic layer 110 on the first magnetic layer 108 and a second magnetic layer 112 including cobalt on the non-magnetic layer 110.

The MTJ 104 further includes a spacer layer 114 on the magnetic layer 112 of the magnetic structure 106, a magnet 116 on the spacer layer 114. The magnet 116 has a magnetization 117 that remains fixed during operation. Such a magnet 116 is herein referred to as a fixed magnet 116. For example, magnetization 117 may remain substantially fixed in a positive or in a negative Z-direction. In the illustrative embodiment, the magnetization 117 is directed toward a negative Z direction. The direction of magnetization 117 is perpendicular to a plane of an uppermost surface 101A of the electrode 101. The fixed magnet 116 having a magnetization 117 that is perpendicular to the plane of the uppermost surface 101A may also be known as a perpendicular fixed magnet 116. The MTJ 104 further includes a layer 118 including a metal and oxygen on the fixed magnet 116. In the illustrative embodiment, layer 118 is a tunnel barrier 118. In an embodiment, the tunnel barrier has a <001> crystal texture. The MTJ 104 further includes a second magnet 120 on the tunnel barrier 118, where the second magnet 120 has a second magnetization 121.

The magnetic structure 106 is antiferromagnetically coupled with the magnet 116 to ensure that the magnetization 117 in the fixed magnet 116 stays in a programmed direction (for example in negative Z direction in FIG. 1A). Such a magnetic structure 106 is herein referred to as a pinning structure 106. In the illustrative embodiment, the magnetizations 107 and 117 are oppositely directed and coupled though the spacer layer 114. To ensure that the magnetization 107 pins or fixes the magnetization 117, the pinning structure 106 has sufficient greater PMA than a PMA of the fixed magnet 116. In an embodiment, the non-magnetic layer 110 includes platinum. In some such embodiment, interfaces between surfaces 108A and 110A and surfaces 112A and 110B provide interfacial magnetic anisotropy to the pinning structure 106. A layer of platinum non-magnetic layer 110 is sufficient to pin the magnetization 117 in the fixed magnet 116.

While a cobalt-platinum interfaces between surfaces 108A and 110B and between surfaces 112A and 110B can provide strong PMA, it is desirable for a platinum non-magnetic layer 110 to have a thickness that promotes low levels of diffusion. When the fixed magnet includes iron, iron can diffuse from the fixed magnet 116 to the pinning structure 106 and platinum can diffuse from the pinning structure 106 to the fixed magnet 116. In an embodiment, the platinum non-magnetic layer 110 has a thickness of at least 0.015 nm but less than 0.4 nm. A thickness of approximately 0.015 nm provides adequate interfacial PMA to the pinning structure 106. Non-magnetic layer 110 having a thickness of approximately 0.4 nm also provides a relatively smaller volume for iron-platinum bonding in the non-magnetic layer 110 than for example a substantially thicker platinum non-magnetic layer 110 that is for example 1 nm or more.

In some embodiments, the non-magnetic layer 110 includes tungsten. Cobalt-tungsten interfaces between surfaces 108A and 110A and between surfaces 112A and 110B can provide PMA. In an embodiment, the tungsten non-magnetic layer 110 has a thickness of at least 0.1 nm but less than 0.4 nm. A thickness of approximately 0.1 nm is sufficiently continuous to provide interfacial PMA to the pinning structure 106. Non-magnetic layer 110 having a thickness of approximately 0.4 nm also provides a relatively smaller volume for iron-platinum bonding in the non-magnetic layer 110 than for example a substantially thicker (for example 1 nm or more) platinum non-magnetic layer 110.

The magnetic layers 108 and 112 may have a same thickness or a different thickness. For example, the cobalt magnetic layer 108 may have a thickness between 0.4 nm and 1.5 nm. A thickness between 0.4 nm and 1.5 nm is desired to maintain perpendicular magnetic anisotropy in the cobalt magnetic layer 108. Similarly, the cobalt magnetic layer 112 may have a thickness between 0.4 nm and 1.5 nm.

In an embodiment, the cobalt magnetic layer 108 and 112 each have a substantially the same thickness between 0.4 nm and 1.5 nm.

To provide sufficiently high PMA in pinning structure 106, the pinning structure 106 is adjacent to conductive layer 102 having a FCC <111> crystal texture. Such a conductive layer 102 provides a template favorable for FCC (111) texture in the cobalt magnetic layer 108. To reduce platinum diffusion in the memory device 100, the conductive layer 102 includes iridium instead of platinum. Iridium has a FCC <111> crystal texture. The iridium conductive layer 102 is substantially lattice matched to a buffer layer 122 directly below and to the cobalt magnetic layer 108 above.

In some embodiments, the conductive layer 102 includes trace amounts of iron having a concentration that varies from an uppermost surface 102A to lowermost surface 102B. In an embodiment, the iron concentration varies by up to 1% where a high concentration is at interface between surface 108B and uppermost surface 102A. An iron concentration less than 1% is sufficiently low to provide a TMR ratio above 100%. In some embodiments, the conductive layer 102 includes trace amounts of cobalt having a concentration that varies from an uppermost surface 102A to lowermost surface 102B. In an embodiment, the concentration varies by up to 1% where a high concentration is at interface between the surface 102A and a low concentration at surface 102B. In an embodiment, the conductive layer 102 has a thickness between 0.5 nm and 5 nm. In some exemplary embodiments, the conductive layer 102 has a thickness between 1 nm and 5 nm to be sufficiently continuous.

The crystalline texture of the conductive layer 102 is dependent on the directly adjacent buffer layer 122. In one example, the buffer layer 122 includes TaN, Ta, W, Ru. In another embodiment, the buffer layer 122 includes multi-layers including or alloys thereof of Ru, TaN, Ta, or W. In such an example, the second buffer layer 122 may be predominantly tungsten. In some such examples, the buffer layer 122 can have a thickness between 0.1 nm and 3 nm. In other embodiments, the buffer layer 122 may have a graded concentration of tungsten, where the percent of tungsten decreases from a lower most surface 122A to an uppermost surface 122B. In some such embodiments the lower most portions of the buffer layer 122 is between 20% and 40% tungsten. In other examples, the buffer layer 122 has a composition that is no more than 50% tungsten and a balance that is substantially ruthenium. In some such embodiments, the buffer layer 122 has a thickness that is less than 5 nm. In an embodiment, the buffer layer 122 includes a multilayer with a first layer including tungsten and a second layer including ruthenium on the layer of tungsten. A Ru-rich material has crystal structure that is compatible for interfacing with conductive layer 102.

As discussed above the spacer layer 114 includes a material that provides anti-ferromagnetic coupling between the pinning structure 106 and the fixed magnet 116. The pinning structure 106 is anti-ferromagnetically coupled with the fixed magnet 116 through the spacer layer 114. When a spacer layer 114 includes ruthenium or iridium, spacer layer 114 provides anti-ferromagnetic coupling. A material such as ruthenium or iridium has a FCC (111) crystal structure. In some examples, when the spacer layer 114 includes ruthenium, the iridium spacer layer 114 has a thickness that is approximately 0.5 nm or approximately 1.4 nm. In other examples, when a spacer layer 114 includes ruthenium, the ruthenium spacer layer 114 has a thickness of approximately 0.4 nm or approximately 0.8 nm.

The chemical composition of the magnet 116 may vary depending on the embodiment. In an embodiment, the fixed magnet 116 includes magnetic materials and has a thickness for sufficiently perpendicular magnetization. In an embodiment, the magnet 116 of the MTJ 104 can include alloys such as CoFe, CoFeB, FeB. The alloys of CoFe, CoFeB, FeB may include doping with one or more of Ta, Hf, Mo, Ir, Ru, Si or C, to promote high perpendicular anisotropy. In an embodiment, the magnet 116 comprises a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the magnet 116 is FeB, where the concentration of boron is between 10-40 atomic percent of the total composition of the FeB alloy. Alternatively, the magnet 116 may include a layer of Co directly adjacent to spacer layer 114, a layer of Ta, W or Mo on the layer of Co, and an alloy of CoFe, CoFeB, FeB on the layer of Ta, W or Mo to enable transition in crystal texture in the magnet 116 from FCC (111) to BCC (001). The layer of cobalt may range in thickness between 0.4 nm and 1 nm. The layer of Ta, W or Mo has a thickness of at least 0.1 nm but less than 0.4 nm. The alloy of CoFe, CoFeB, FeB may have a thickness that is less then 1.5 nm to provide perpendicular magnetic anisotropy to the magnet 116.

The magnet 116 has a magnetization 117 that remains fixed during operation. Such a magnet 116 is herein referred to as a fixed magnet 116. For example, magnetization 117 may remain substantially fixed in a positive or in a negative Z-direction. In the illustrative embodiment, the magnetization 117 is directed toward a negative Z direction. The direction of magnetization 117 is perpendicular to a plane of an uppermost surface 101A of the electrode 101. The fixed magnet 116 having a magnetization 117 that is perpendicular to the plane of the uppermost surface 101A may also be known as a perpendicular fixed magnet 116.

In an embodiment, tunnel barrier 118 includes a material suitable for allowing electron current having a majority spin to pass through tunnel barrier 118, while impeding, at least to some extent, electron current having a minority spin from passing through tunnel barrier 118. Thus, tunnel barrier 118 (or spin filter layer) may also be referred to as a tunneling layer for electron current of a particular spin orientation. In an embodiment, the tunnel barrier 118 includes a material such as, but not limited to, oxygen and at least one of magnesium (e.g., a magnesium oxide, or MgO), or aluminum (e.g., an aluminum oxide such as $Al_2O_3$). In the illustrative embodiment, the tunnel barrier 118 including MgO has a crystal orientation that is (001) and is lattice matched to fixed magnet 116 below the tunnel barrier 118 and free magnet 120 above tunnel barrier 118. In an embodiment, a free magnet 120 including a $Co_{100-x-y}Fe_xB_y$, is highly lattice matched to the tunnel barrier 118 including an MgO. Lattice matching a crystal structure of the free magnet 120 with the tunnel barrier 118 enables a higher tunneling magnetoresistance (TMR) ratio in the MTJ 104. In an embodiment, tunnel barrier 118 is MgO and has a thickness in the range between 0.9 nm and 2 nm. In exemplary embodiments, where magnet 116 and magnet 120 include CoFeB, MgO is between 0.9 nm and 1.1 nm.

The magnet 120 has a magnetization 121 that may change orientation during operation. Such a magnet 120 is herein referred to as a free magnet 120. For example, magnetization 121 may orient in the positive or negative Z-direction as indicated by the bi-directional arrow. The direction of magnetization 121 is perpendicular to a plane of an uppermost surface 101A of the electrode 101. The free magnet 120, having a magnetization 121 that is perpendicular to the plane of the uppermost surface 101A, may also be known as a perpendicular free magnet 120. When the magnetization 121 is oriented parallel to magnetization 111 the memory device 100 is in a low electrical resistance state. When the magnetization 121 is oriented parallel to magnetization 111 the memory device 100 is in a high electrical resistance state relative to the low electrical resistance state. The difference in electrical resistance between the high and low states ranges between 2 KOhm and 10 KOhm.

In an embodiment, the free magnet 120 includes magnetic materials and has a thickness for sufficiently perpendicular magnetization. In the illustrative embodiment, the free magnet 120 includes a magnetic material such as Co, Ni, Fe or alloys of these materials. In an embodiment, the free magnet 120 includes a magnetic material such as CoB, FeB, CoFe or CoFeB. In some embodiments, the free magnet 120 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 120 is FeB, where the concentration of boron is between 10 and 40 atomic percent of the total composition of the FeB alloy. In an embodiment, free magnet 120 has a thickness between 1 nm and 1.5 nm.

In an embodiment, the MTJ 104 further includes a capping structure 126 on the free magnet 120. Capping structure 126 provides interfacial protection against iron or oxygen diffusion. In an embodiment, the capping structure 126 includes one or more layers to increase perpendicular magnetic anisotropy in the MTJ 104. For example, capping structure 126 may include a dielectric layer (including Mg and O) in contact with the free magnet 120 and a conductive layer (including CoFeB, Ta, Ru or W) on the dielectric layer. In other embodiments, capping structure 126 includes one or more of Ta, Ru or W. Capping structure 126 may have a thickness between 1.5 nm to 5 nm.

In an embodiment, the memory device 100 further includes a second electrode 128 above the fixed magnet 120. In the illustrative embodiment, the electrode 128 in directly on the capping structure 126. In some examples, electrode 128 includes one or more Ta, TaN or TiN. In an embodiment, the electrode 128 has a thickness between 5 nm and 70 nm. In some embodiments, the electrode 101 includes one or more layers. For example, the one or more layers may include TaN, Ta, W, Ru or TiN. In an embodiment, the electrode 101 includes TiN having a columnar grain boundary.

The memory device 100 may above a substrate 130, as shown. In an embodiment, the substrate 130 includes a suitable semiconductor material such as but not limited to, single crystal silicon, polycrystalline silicon and silicon on insulator (SOI). In another embodiment, substrate 130 includes other semiconductor materials such as germanium, silicon germanium or a suitable group III-N or a group III-V compound. Logic devices such as MOSFET transistors and access transistors and may be formed on the substrate 130. Logic devices such as access transistors may be integrated with memory devices such as memory device 100 to form embedded memory. Embedded memory including memory device 100 and logic MOSFET transistors can be combined to form functional integrated circuit such as a system on chip. In an exemplary embodiment, MTJ 104 is a perpendicular MTJ (pMTJ) 104.

In other embodiments, the pinning structure 106 may include a layer of platinum to provide sufficient PMA and a layer of tungsten above the layer of platinum to provide a diffusion barrier.

Figure 1B:
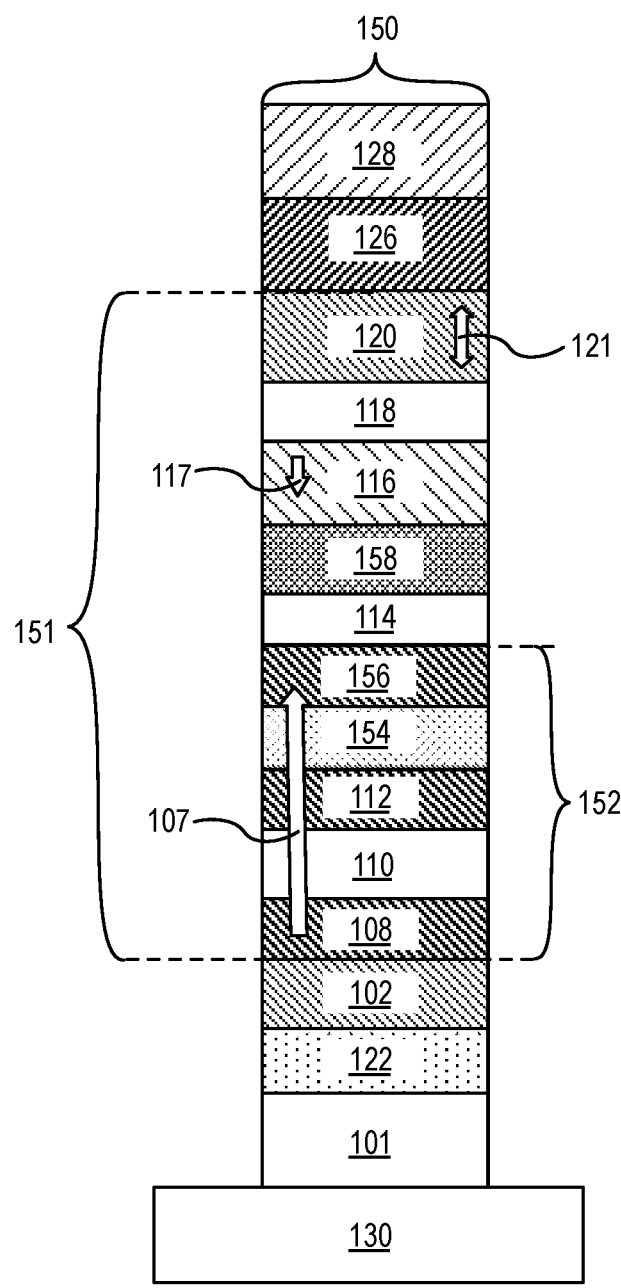
FIG. 1B illustrates a cross-sectional view of a memory device, in accordance with an embodiment of the present disclosure.

FIG. 1B illustrates a memory device 150 in accordance with an embodiment of the present disclosure. The memory device 150 includes first electrode 101, conductive layer 102 including iridium above the first electrode 101 and magnetic tunnel junction (MTJ) 151 on the conductive layer 102. The MTJ 151 includes a magnetic structure 152. In an embodiment, the magnetic structure 152 includes magnetic layer 108 including cobalt, non-magnetic layer 110 including platinum on the magnetic layer 108 and magnetic layer 112 including cobalt on the non-magnetic layer 110. The magnetic structure 152 further includes non-magnetic layer 154 including tungsten on the cobalt magnetic layer 112, and magnetic layer 156 on non-magnetic layer 154.

The addition of non-magnetic layer 154 including tungsten between the non-magnetic layer 110 and the fixed magnet 116 provides a diffusion barrier against iron and platinum interdiffusion. In an embodiment, a tungsten non-magnetic layer 154 has a thickness between 0.1 nm and 0.4 nm. A thickness between 0.1 nm and 0.4 nm is sufficiently thick to provide an interdiffusion barrier for example, against iron from the fixed magnet 116 and platinum from the non-magnetic layer 110.

The magnetic layer 156 may include cobalt. In some examples, the cobalt magnetic layer 156 may have a thickness between 0.4 nm to 1.5 nm. In an embodiment, the presence of an additional magnetic layer 156 increases a total magnetic moment of the pinning structure 152. The moment may be reduced by reducing thickness of the magnetic layers 108, 112 and 156.

In the illustrative embodiment, the memory device 150 further includes spacer layer 114 on the magnetic layer 156 and a conductive structure 158 on the spacer layer 114. Conductive layer structure has an uppermost layer having a body centered cubic (BCC)<111> structure which provides a break in texture from an adjacent FCC <111> material below. In an embodiment, the conductive structure 158 includes a first layer of cobalt and a second layer including one or more of tantalum, molybdenum or tungsten on the first layer of cobalt. In some embodiments, the first layer has a thickness between 0.1 nm and 0.4 nm and the second layer has a thickness of at least 0.1 nm.

The MTJ 151 further includes a tunnel barrier 118 on the fixed magnet 116. In an embodiment, the tunnel barrier has a <001> crystal texture. The MTJ 151 further includes a second magnet 120 with magnetization 121 on the tunnel barrier 118, a capping structure 126 on the magnet 120 and electrode 128 on the capping structure 126.

In some embodiments, the presence of non-magnetic layer 154 can help increase TMR when memory device 150 is subjected to anneal at temperatures greater than 400 degrees Celsius. Reduced interdiffusion of iron and platinum may provide enhanced crystallization of fixed layer with high temperature anneal.

In another embodiment, the pinning structure 106 includes a single magnet rather than a multilayer stack discussed above. In some such embodiments, the single magnet has a magnetic moment that is greater than a magnetic moment of the fixed magnet.

Figure 1C:
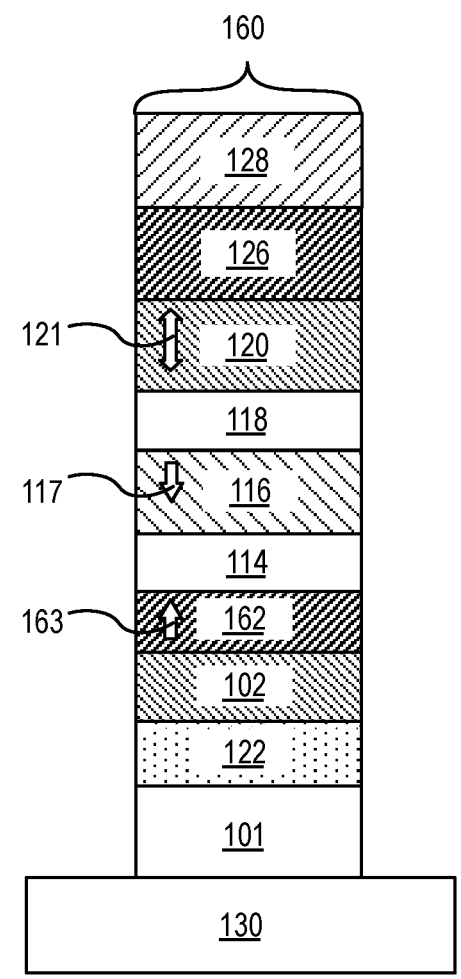
FIG. 1C illustrates a cross-sectional view of a memory device, in accordance with an embodiment of the present disclosure.

FIG. 1C illustrates a memory device 160 having a pinning magnet 162 between the conductive layer 102 and the spacer layer 114. In the illustrative embodiment, the pinning magnet 162 includes a magnetic material. Pinning magnet 162 has a magnetization 163 that is oppositely directed to magnetization 117.

The pinning magnet 162 has a magnetic moment that is greater than a magnetic moment of the fixed magnet 116 to pin the magnetization 117. Examples of the pinning magnet may include materials of the fixed magnet 116. In an embodiment the pinning magnet 162 includes cobalt. In an embodiment, the cobalt pinning magnet 162 has a thickness between 1 nm and 2 nm. In one such embodiment, the fixed magnet includes materials and has a thickness where the magnetic moment of the fixed magnet 116 is less than a magnetic moment of the pinning magnet 162.

As discussed above there are benefits of a conductive layer 102 which includes iridium rather than platinum directly adjacent to the pinning structure 106.

Figure 2A:
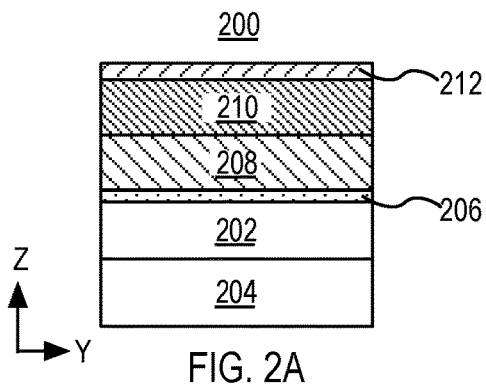
FIG. 2A illustrates a cross-sectional view of a stack including magnetic and non-magnetic layers, in accordance with an embodiment of the present disclosure.

FIG. 2A is a cross sectional illustration of a material layer stack that includes a bottom electrode 202 above a substrate 204, a buffer layer 206 above the electrode 202, a magnet 208 on the buffer layer 206, a conductive layer 210 on the magnet 208 and a top electrode 212 on the conductive layer 210.

In an embodiment, the bottom electrode 202, substrate 204, buffer layer 206, magnet 208 and top electrode 212 each include a material that is the same or substantially the same as the material of the electrode 101, substrate 126, buffer layer 116, magnet 110 and electrode 130, respectively.

In the illustrative embodiment, the material layer stack 200 has the following composition. The bottom electrode 202 includes TiN and has a thickness of approximately 10 nm, the buffer layer 206 includes tungsten and has a thickness of approximately 0.5 nm, the magnet 208 includes cobalt, boron and iron and has a thickness of approximately 10 nm and the top electrode 212 includes W and has a thickness of approximately 3 nm. In one embodiment, the conductive layer 210 includes iridium and in a second embodiment the conductive layer 210 includes platinum.

A chemical analysis of the material layer stack 200 was performed using a secondary ion mass spectroscopic (SIMS) method. The SIMS chemical analysis was performed after deposition of the material layer stack 200 and after annealing at a temperature of approximately 420 degrees.

Figure 2B:
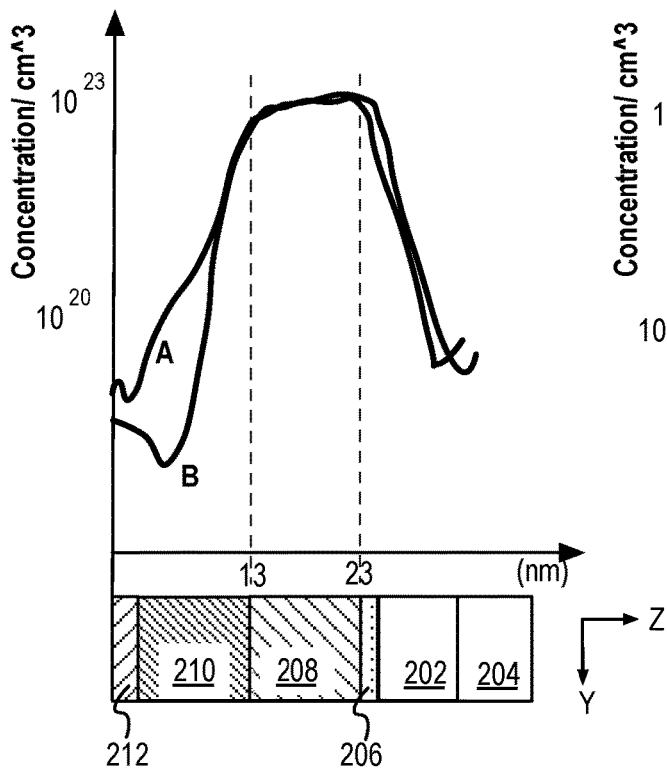
FIG. 2B illustrates plots of iron in various layers in the stack of FIG. 2A pre and post anneal when a conductive layer in the stack includes iridium.

Results of the SIMS chemical analysis performed before and after deposition are plotted in FIG. 2B for a material layer stack where a conductive layer 210 includes iridium. The material layer stack 200 is illustrated on the horizontal axis (depth). The thicknesses (in nm) of the layers in the material layer stack 200 correspond to depth of the SIMS measurement. The vertical axis denotes concentration (number of atoms/cm^3). Line B indicates a concentration of iron as measured through the depth of the material layer stack 200 before annealing. Line A indicates a concentration of iron as measured through the depth of the material layer stack 200 before annealing. After deposition, iron is present in the adjacent conductive layer 210 due to diffusion and intermixing with a material of the conductive layer 210 to the baseline depth resolution of the SIMS method. Before and after annealing, iron has a maximum concentration that is approximately $10^{22}$ in the conductive layer 210 at an interface between the magnet 208 and conductive layer 210, when the conductive layer 210 includes iridium. However, there is a shift in the minimum iron concentration after annealing. Before anneal iron has a minimum concentration that is approximately $0.5 \times 10^{19}$ in the conductive layer 210, when the conductive layer 210 includes Ir. After anneal, the iron concentration rises from a minimum of $0.5 \times 10^{19}$ to approximately $10^{20}$ in the conductive layer 210, due to diffusion of iron and intermixing between iridium and iron in the conductive layer 210 after the high temperature anneal.

Figure 2C:
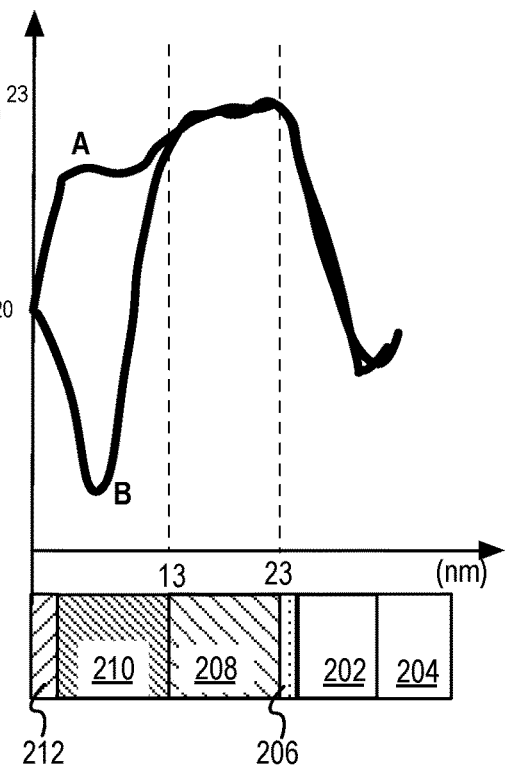
FIG. 2C illustrates plots of iron in various layers in the stack of FIG. 2A pre and post anneal when a conductive layer in the stack includes platinum.

Results of the SIMS chemical analysis performed before and after deposition is plotted FIG. 2C for a material layer stack where a conductive layer 210 includes platinum. The material layer stack 200 is illustrated on the horizontal axis (depth). The thicknesses (in nm) of the layers in the material layer stack 200 correspond to depth of the SIMS measurement. The vertical axis denotes concentration (number of atoms/cm^3). Line B indicates a concentration of iron as measured through the depth of the material layer stack 200 before annealing. Line A indicates a concentration of iron as measured through the depth of the material layer stack 200 before annealing. After deposition iron is present in the adjacent conductive layer 210 due to diffusion and intermixing with a material of the conductive layer 210 to the baseline depth resolution of the SIMS method. Before and after annealing, iron has a maximum concentration that is approximately $10^{22}$ in the conductive layer 210 near an interface between the magnet 208 and conductive layer 210, when the conductive layer 210 includes platinum. However, there is a shift in the minimum iron concentration after annealing. The iron concentration in material layer stack 200, that includes a platinum conductive layer 210, rises from a minimum of $0.5 \times 10^{19}$ to approximately $10^{22}$ in the conductive layer 210, due to diffusion of iron and intermixing between platinum and iron in the conductive layer 210 after the high temperature anneal. It is to be appreciated that diffusion of iron into a layer including Pt may adversely affect the magnetic anisotropy.

The two plots in FIGS. 2B and 2C show that the relative diffusion of iron into the conductive layer 210 including iridium is less than diffusion of iron into conductive layer 210 including platinum by over an order of magnitude. A lower diffusion into a conductive layer 210 including iridium may be due to lower intermixing between iron and iridium compared to intermixing between iron and platinum. In the illustrative embodiment, the magnet 208 has thickness such that the magnetization is in plane (parallel to Y axis). A lower level of iron diffusion from the magnet 208 may preserve in-plane magnetic anisotropy of the magnet 208. In an embodiment, when magnet 208 has a thickness sufficient low (2 nm or less for example), magnet 208 is considered to have a perpendicular anisotropy. In such embodiments, preservation of perpendicular magnetic anisotropy can increase TMR in a memory device.

Figure 2D:
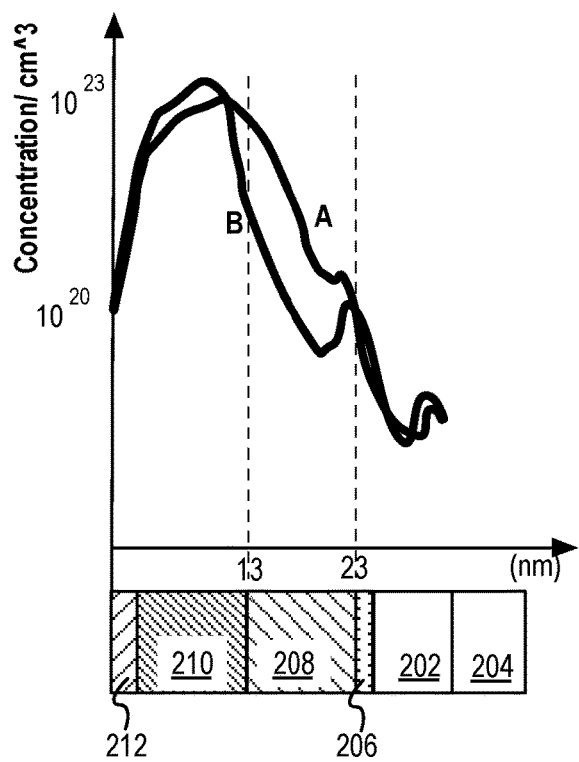
FIG. 2D illustrates plots of platinum through various layers in the stack of FIG. 2A pre and post anneal when a conductive layer in the stack includes platinum.

Results of the SIMS chemical analysis performed before and after deposition is plotted FIG. 2D for a material layer stack where a conductive layer 210 includes platinum. The material layer stack 200 is illustrated on the horizontal axis (depth). The thicknesses (in nm) of the layers in the material layer stack 200 correspond to depth of the SIMS measurement. The vertical axis denotes concentration (number of atoms/cm^3). Line B indicates a concentration of platinum as measured through the depth of the material layer stack 200 before annealing. Line A indicates a concentration of platinum as measured through the depth of the material layer stack 200 after annealing. The platinum concentration peaks within the first 13 nm and decays with depth. After annealing the platinum concentration in the magnet 208 generally is approximately an order of magnitude greater that a platinum concentration in the magnet 208 before annealing, illustrating diffusion of platinum.

Figure 2E:
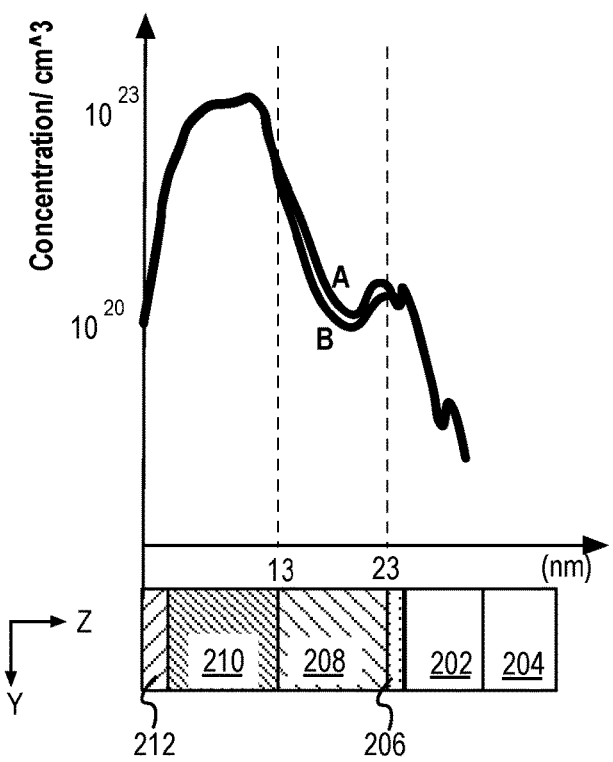
FIG. 2E illustrates plots of iridium through various layers in the stack of FIG. 2A pre and post anneal when a conductive layer in the stack includes iridium.

Results of the SIMS chemical analysis performed before and after deposition is plotted FIG. 2E for a material layer stack where a conductive layer 210 includes iridium. The material layer stack 200 is illustrated on the horizontal axis (depth). The thicknesses (in nm) of the layers in the material layer stack 200 correspond to depth of the SIMS measurement. The vertical axis denotes concentration (number of atoms/cm^3). Line B indicates a concentration of iridium as measured through the depth of the material layer stack 200 before annealing. Line A indicates a concentration of iridium as measured through the depth of the material layer stack 200 after annealing. The iridium concentration peaks within the first 13 nm and decays with depth. After annealing the iridium concentration in the magnet 208 generally after annealing is substantially the same as the iridium concentration in the magnet 208 before annealing, illustrating very little diffusion of iridium. A substantially similar iridium concentration before and after anneal also illustrates that a high temperature anneal does not cause iridium to diffuse like platinum into the adjacent magnet 208.

Preservation of PMA in a perpendicular magnet can increase TMR in a memory device that includes a thinner (2 nm or less) embodiment of magnet 208. Diffusion of iron from a magnet such as magnet 208 may also adversely affect a pinning structure that includes platinum leading to lower PMA in the pinning structure.

Figure 3:
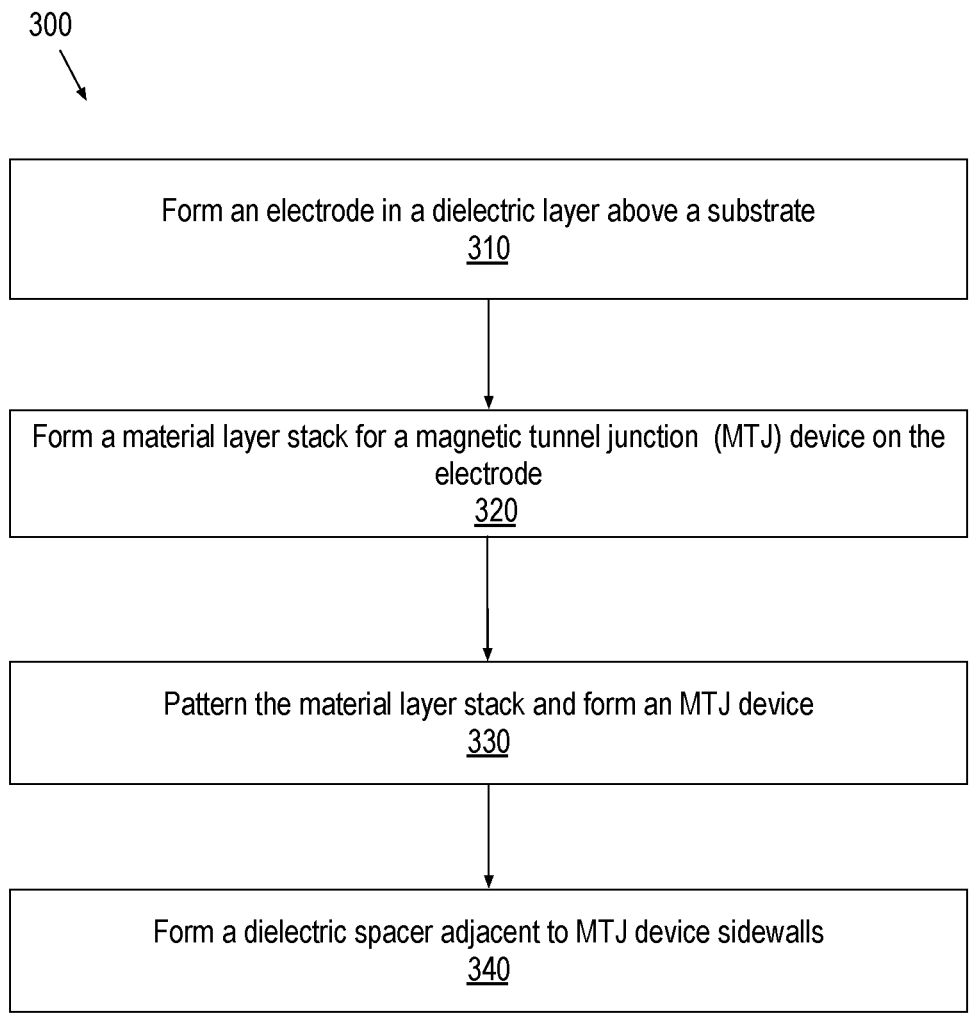
FIG. 3 illustrates a flow diagram of a method to fabricate a memory device.

FIG. 3 illustrates a flow diagram of a method to fabricate a memory device such as the memory device 100. The method 300 begins at operation 310 by forming a bottom electrode above a conductive interconnect formed in a dielectric layer a substrate. The method continues at operation 320 with the formation of an iridium conductive layer having an FCC <111> crystal texture, formation of a pinning magnetic layer having an FCC <111> crystal texture on the seed layer and formation of layers of an MTJ material layer stack. At operation 330, the method 300 involves patterning the material layer stack to form a memory device. The method concludes at operation 340 with formation of a dielectric spacer adjacent to sidewalls of the memory device.

FIGS. 4A-4E illustrate cross-sectional views representing various operations in a method of fabricating a memory device, such as the memory device 100 in accordance with embodiments of the present disclosure.

Figure 4A:
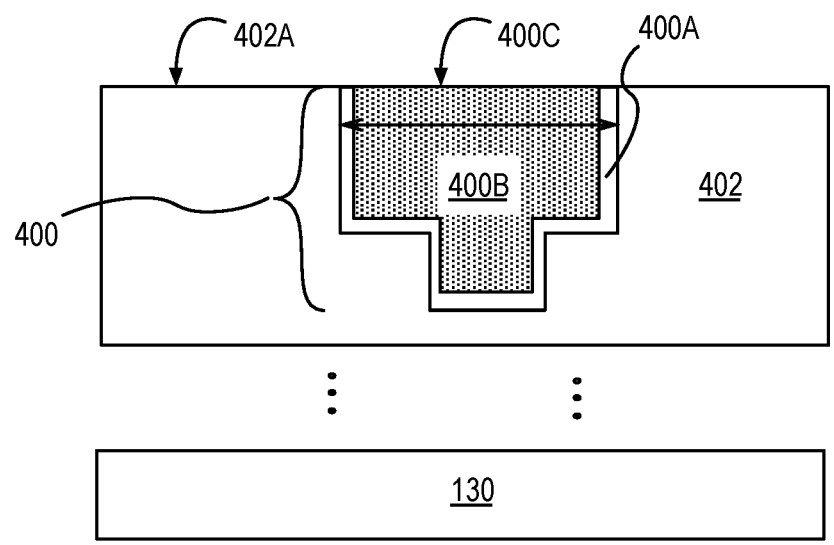
FIG. 4A illustrates a conductive interconnect formed above a substrate.

FIG. 4A illustrates a conductive interconnect 400 formed above a substrate 150. In some embodiments, the conductive interconnect 400 is formed in a dielectric 402, above a substrate 130, such as is shown. In an embodiment, the conductive interconnect 400 includes a barrier layer 400A and a fill metal 400B. In some examples, the barrier layer 400A includes a material such as tantalum nitride or ruthenium. In some examples, the fill metal 400B includes a material such as cobalt, copper or tungsten. In other examples, the conductive interconnect 400 is fabricated using a subtractive etch process when materials other than copper are utilized. In an embodiment, the dielectric 402 includes a material such as but not limited to silicon dioxide, silicon nitride, silicon carbide, or carbon doped silicon oxide. The dielectric 402 may have an uppermost surface 402A that is substantially co-planar with an uppermost surface 400C of the conductive interconnect 400, as is illustrated. In some embodiments, conductive interconnect 400 is electrically connected to a separate circuit element such as a transistor (not shown).

Figure 4B:
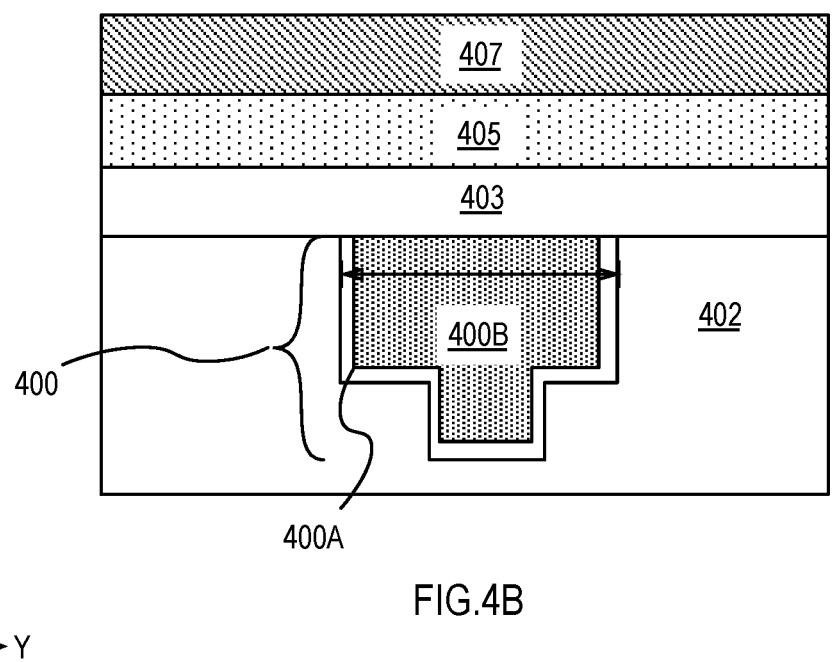
FIG. 4B illustrates the structure of FIG. 4A following the formation of an electrode layer, buffer layer on the electrode layer, a seed layer on the buffer layer.

FIG. 4B illustrates the structure of FIG. 4A following the formation of an electrode layer 403 on the conductive interconnect 400 and over the dielectric 402. In an embodiment, the electrode layer 403 includes a material that is the same or substantially the same as the material of the electrode 101.

A buffer layer 405 is formed on the electrode layer 403. In an embodiment, the buffer layer 405 is formed by reactively co-sputtering tungsten and ruthenium onto the electrode layer 403. Depending on the material composition desired, the atomic percent of tungsten and ruthenium can be controlled during the deposition process. The atomic percent of tungsten and ruthenium can be varied during the deposition process to create an alloy having a gradient in the constituents of the alloy.

In a second embodiment, buffer layer 405 is formed by a deposition process where a thin layer of Ru is deposited onto a thin layer of tungsten, and where the deposition process is continued until a plurality of alternating layers of W and Ru are formed. The resulting material layer stack can be annealed to diffuse and intermix the W and the Ru forming the buffer layer 405. In some such embodiments, the layer of tungsten is between 0.05 nm and 1 nm, and the layer of ruthenium is between 0.05 nm and 1 nm.

In a third embodiment, buffer layer 405 is formed by sputtering an alloyed material from a Ru—W alloy target. In an embodiment, each Ru—W alloy target may have a particular relative atomic percent of W and Ru. In some embodiments, multiple Ru—W alloy targets each with different relative atomic percent of W and Ru may be utilized to deposit a plurality of alloy layers.

In one or more embodiments, deposition of the buffer layer 405 may begin by first depositing a layer of predominantly tungsten and then forming buffer layer 405 on the layer of predominantly tungsten. In some such embodiments, the deposition process further includes depositing a layer of ruthenium on the buffer layer 405, where the ruthenium has a thickness less than 0.5 nm. In or more of the embodiments, the buffer layer 405 has a thickness between 0.5 nm and 10 nm.

A conductive layer 407 is formed on the buffer layer 405. In an embodiment, as discussed above, the alloying of W and Ru changes the crystallographic texture of the buffer layer 405, compared to a layer of predominantly Ru or predominantly W. The crystallographic texture of the buffer layer 405 may enable an iridium conductive layer 407 to be grown with an FCC <111> crystal texture. The iridium conductive layer 407 may be deposited to a thickness between 0.5 nm-5 nm.

Figure 4C:
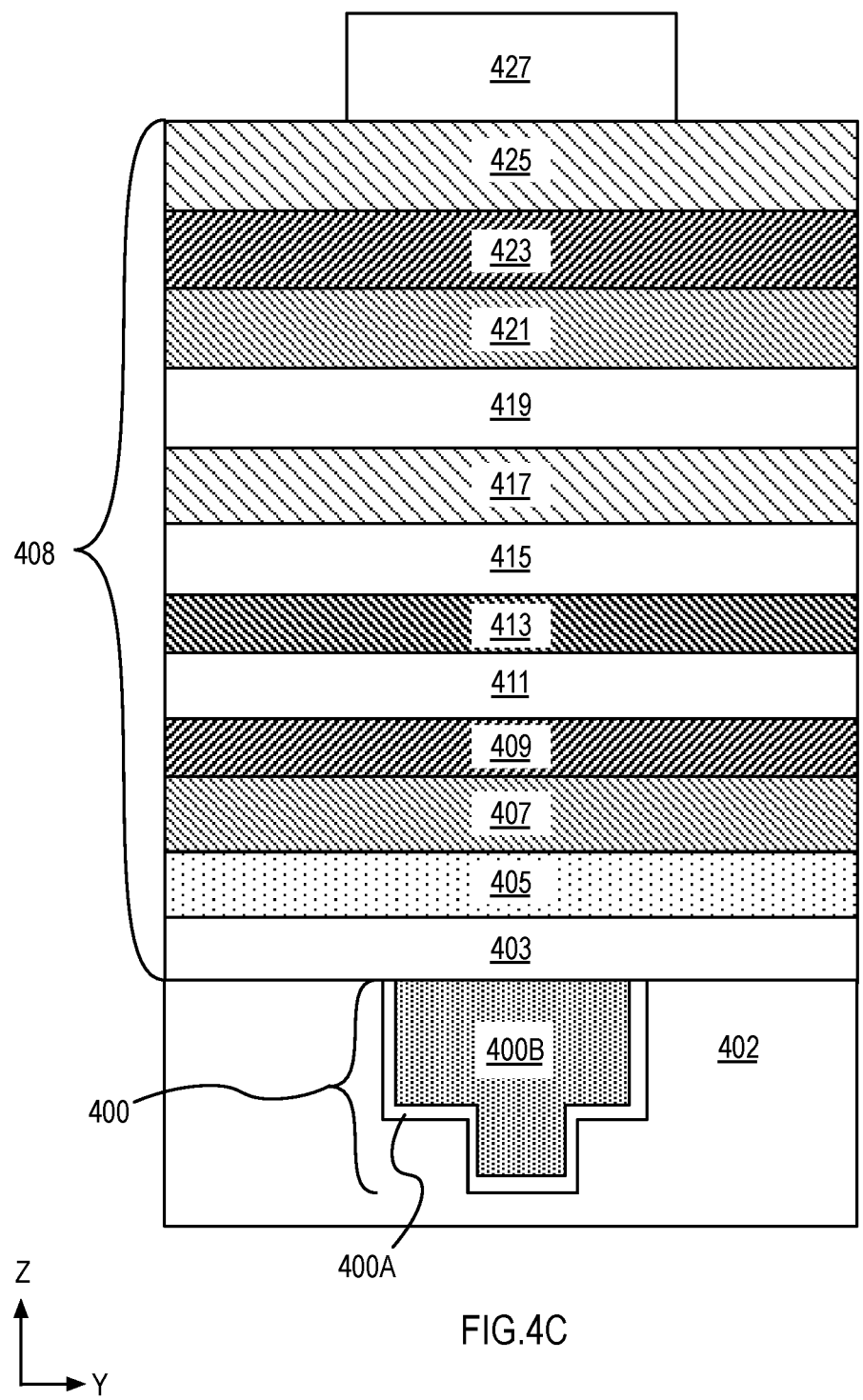
FIG. 4C illustrates a cross-sectional view of the structure in FIG. 4B following the formation of plurality of layers in a material layer stack for a memory device, followed by a mask on the material layer stack.

FIG. 4C illustrates a cross-sectional view of the structure in FIG. 4B following the formation of layers in a material layer stack 408 for a memory device.

In an embodiment, the deposition process continues (after formation of the conductive layer 407) where one or more layers in pinning structure are deposited on the conductive layer 407. In some embodiments, layers in pinning structure are blanket deposited on the conductive layer 407 using a PVD process. In the illustrative embodiment, the layers in pinning structure are the same as the layers in pinning structure 106, described above.

As shown, formation of layers for a pining structure include deposition of a magnetic layer 409 including cobalt. In an embodiment, the conductive layer 407 including an FCC <111> crystal texture enables a lattice matching with the magnetic layer 409. Such lattice matching enables the formation of fixed magnetic structure with strong perpendicular magnetic anisotropy above the layers in the pinning structure. Furthermore, a conductive layer 407 grown with reduced strain mismatch enables the magnetic layer 409 to be grown with an increased perpendicular anisotropy.

A nonmagnetic layer 411 is deposited on the magnetic layer 409. In some embodiments the nonmagnetic layer 411 includes platinum. In some such embodiments, the platinum nonmagnetic layer 411 has a thickness of at least 0.015 nm but less than 0.4 nm. In some embodiments the nonmagnetic layer 411 includes tungsten. In some such embodiments, the tungsten nonmagnetic layer 411 has a thickness of at least 0.1 nm but less than 0.4 nm. A magnetic layer 413 including cobalt is then deposited on the nonmagnetic layer 411. In an embodiment, the magnetic layer 409 and magnetic layer 413 each are deposited to a thickness between 0.4 nm and 2 nm to form a pinning structure having a perpendicular magnetic anisotropy.

A coupling layer 415 is formed on magnetic layer 413. The coupling layer 415 includes a material that is the same or substantially the same as the spacer layer 114. The thickness of the coupling layer 415 is controlled to provide interlayer coupling between the layers 409, 411 and 413 for a pinning structure and a fixed magnet to be formed. The coupling layer 415 may have a material and thickness to provide antiferromagnetic coupling. In an embodiment, the coupling layer 415 includes ruthenium or iridium. An iridium coupling layer 415 is deposited to a thickness of approximately 0.5 nm or approximately 1.4 nm to provide anti-ferromagnetic coupling. A ruthenium coupling layer 415 is deposited to a thickness of 0.4 nm or approximately 0.8 nm to provide anti-ferromagnetic coupling. A precision in thickness during the deposition process ensures that the coupling layer provide anti-ferromagnetic coupling.

The deposition process continues with formation of one or more layers in a fixed magnetic material 417 on the coupling layer 415. In an embodiment, formation of the fixed magnetic material 417 includes deposition of a thin layer of cobalt directly in contact with the coupling layer 415 to avoid interrupting antiferromagnetic coupling. Subsequent to formation of a thin layer of cobalt, in an embodiment, a thin layer of Ta, W or Mo is deposited directly on to thin layer of cobalt to enable transition in crystal texture in the fixed magnetic material 417 from FCC (111) to BCC (001). An alloy of cobalt, iron and boron is sputter deposited on the thin layer of Ta, W or Mo using an alloy target in a deposition toolset. In an embodiment, the deposition process includes a physical vapor deposition (PVD) or a plasma enhanced chemical vapor deposition (PECVD) process. In an embodiment, the PVD deposition process includes an RF or a DC sputtering process. In other embodiments, fixed magnetic material 417 includes materials that are the same or substantially the same as the fixed magnet 116.

The deposition process continues with formation of a tunnel barrier layer 419 is blanket deposited on fixed magnetic material 417. In an embodiment, the tunnel barrier layer 419 includes magnesium and oxygen or aluminum and oxygen. In an exemplary embodiment, the tunnel barrier layer 419 is MgO and is deposited using a reactive sputter process. In an embodiment, the reactive sputter process is carried out at room temperature. In another embodiment, the reactive sputter process is carried out at a temperature between 25-350 degrees Celsius. In an embodiment, the tunnel barrier layer 419 is deposited to a thickness between 0.8 nm to 1 nm. In some examples, the deposition process is carried out in a manner that yields a tunnel barrier layer 419 having an amorphous structure. In some such examples, the amorphous tunnel barrier layer 419 becomes crystalline after performing a high temperature anneal process to be described further below. In other embodiments, the tunnel barrier layer 419 is crystalline as deposited.

In an embodiment, a layer of free magnetic material 421 is blanket deposited on an uppermost surface of the tunnel barrier layer 419. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the free magnetic material 421 is $Co_{100-x-y}Fe_xB_y$, where X and Y each represent atomic percent, further where X is between 50-80 and Y is between 10-40, and further where the sum of X and Y is less than 100. In some embodiments, the free magnetic material 421 includes a material that is the same or substantially the same as the material of the fixed magnet 116 described above. In some examples, the free magnetic material 421 may be deposited to a thickness between 0.9 nm and 2.0 nm. A thickness range between 0.9 nm and 2.0 nm may be sufficiently thin to provide perpendicular magnetic anisotropy required to fabricate a perpendicular MTJ.

In an embodiment, one or more layers in a capping structure 423 are blanket deposited on the surface of the free magnetic material 421. In an embodiment, the one or more layers in a capping structure 423 include one or more materials described in association with layers in capping structure 126. The one or more layers in capping structure 423 may be deposited using a variety of processes (for example, PVD or PECVD) depending on the layers.

The deposition process concludes with the formation of a top electrode layer 425 on the one or more layers in capping structure 423. The top electrode layer 425 includes a suitable material to provide a hardmask for etching the material layer stack 408. In an embodiment, the top electrode layer 425 includes one or more layers of material such as Ta, TaN or TiN. In an embodiment, an as deposited thickness of the top electrode layer 425 ranges between 40 nm and 70 nm.

In an embodiment, after all the layers in the material layer stack 408 are deposited, an anneal is performed. In an embodiment, the anneal process enables formation of a crystalline alloy of one or more of Co, Fe or B in the free magnetic material 421 and in the fixed magnetic material 417. In an embodiment, the anneal is performed immediately post deposition but before forming a mask 427 on the top electrode layer 425. A post-deposition anneal of the material layer stack 408 is carried out in a furnace at a temperature between 350-440 degrees Celsius in a vacuum environment. In an embodiment, the annealing process promotes solid phase epitaxy of the free magnetic material 421 to follow a crystalline template of the adjacent tunnel barrier layer 419 (e.g., MgO). In an embodiment, the anneal also promotes solid phase epitaxy of the fixed magnetic material 417 to follow a crystalline template of the adjacent tunnel barrier layer 419 (e.g., MgO) <001> Lattice matching between the tunnel barrier layer 419 and the fixed magnetic material 417 and <001> lattice matching between the tunnel barrier layer 419 and the free magnetic material 421 enables a TMR ratio of at least 100% to be obtained in the material layer stack 408.

In an embodiment, the mask 427 defines a shape and size of a memory device and a location where the memory device is to be subsequently formed with respect the conductive interconnect 400. In some embodiments, the mask 427 is formed by a lithographic process. In other embodiments, the mask 427 includes a dielectric material that has been patterned.

Figure 4D:
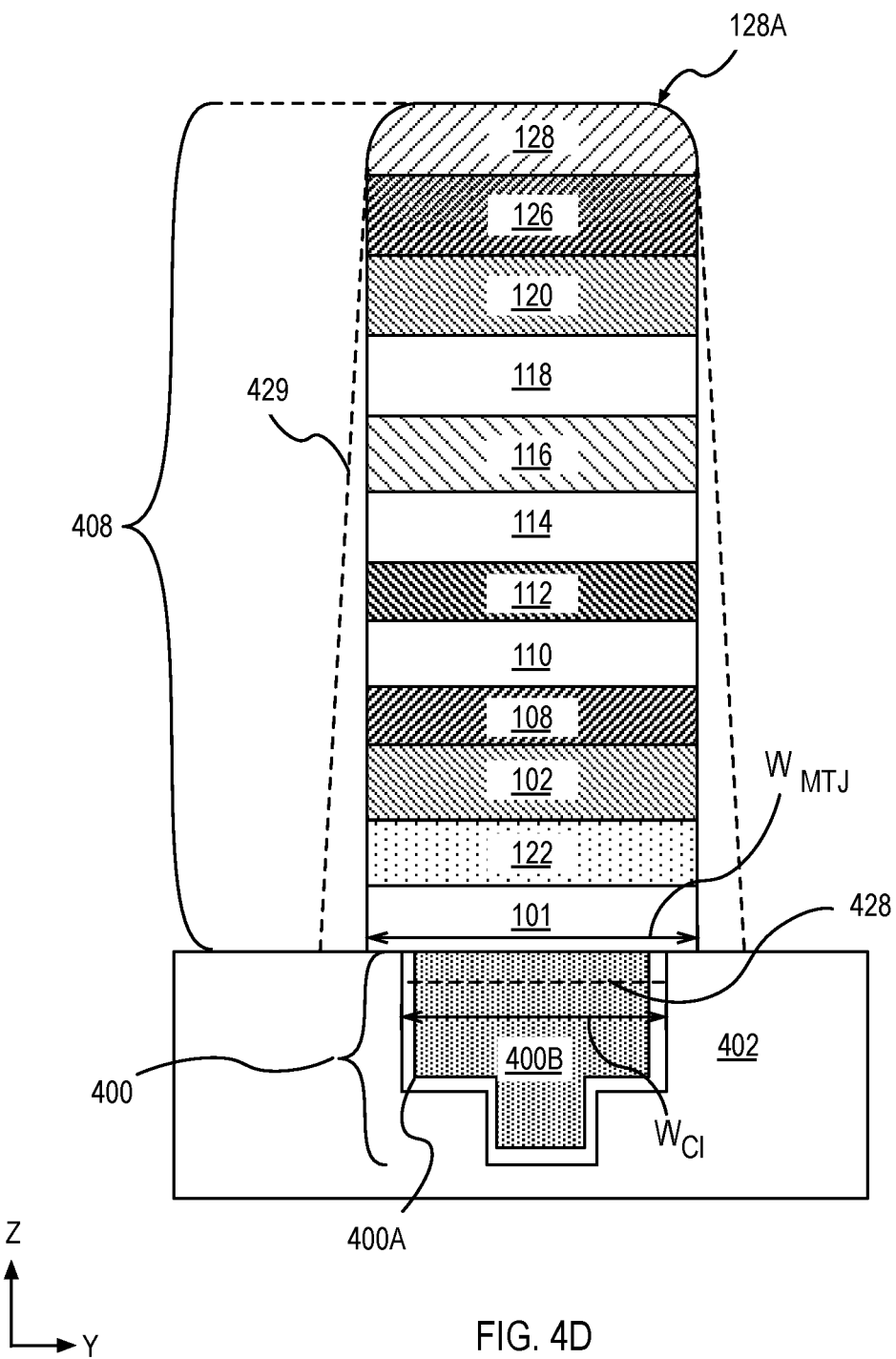
FIG. 4D illustrates a cross-sectional view of the structure in FIG. 4C following the patterning of the material layer stack to form a memory device.

FIG. 4D illustrates a cross-sectional view of the structure in FIG. 4C following the patterning of the material layer stack 408.

In an embodiment, the plasma etch process is utilized to pattern the material layer stack 408 to form a memory device 100. The plasma etch process etches the various layers in the material layer stack 408 to form top electrode 128, capping structure 126, free magnet 120, tunnel barrier 118, fixed magnet 116, spacer layer 114, pinning structure 106 (including magnetic layer 112, non-magnetic layer 110 and magnetic layer 108), conductive layer 102, buffer layer 122 and bottom electrode 101.

In an embodiment, the memory device 100 has a width, $W_{MTJ}$, that is greater than a width $W_{CI}$ of the conductive interconnect 400, as shown. In one such embodiment, the plasma etch process exposes the dielectric 402, when the memory device 100 is formed.

In an embodiment, when the memory device 100 has a width, $W_{MTJ}$, that is less than the width $W_{CI}$ of the conductive interconnect 400, the plasma etch process exposes portions of the conductive interconnect 400. In such an embodiment, the bottom electrode may include a cap across a top portion (above dashed line 428, adjacent to the dielectric 402). A cap across the top portion of the conductive interconnect 400 may prevent exposure of the liner layer 400A and the fill metal 400B. A cap may be highly desirable when the fill metal 400B includes copper.

In some embodiments, depending on the etch parameters, and thickness of the various magnetic layers, the memory device 100 may have sidewalls that are tapered as indicated by the dashed lines 429. In other embodiments the plasma etch process may erode mask 427 and erode corners of the top electrode 128. In one such embodiment, the top electrode 128 has a top surface 128A that may have corners that are rounded, as shown in FIG. 4D.

The memory device 100 formed over the conductive interconnect 400, constitutes a memory device 100 with a perpendicular magnetic tunnel junction (pMTJ) 104.

Figure 4E:
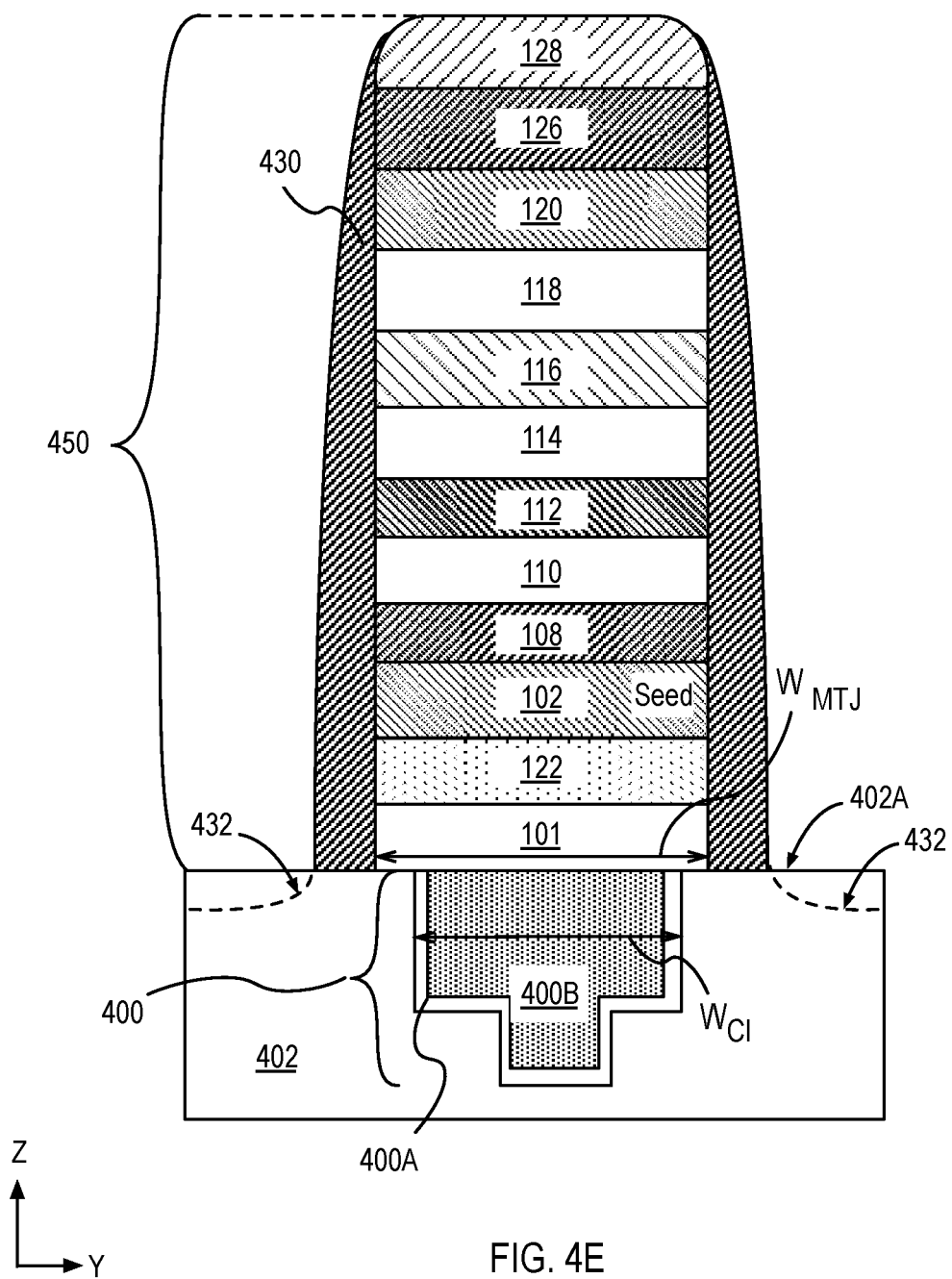
FIG. 4E illustrates a cross-sectional view of the structure in FIG. 4D following the formation of a dielectric spacer adjacent to the memory device.

FIG. 4E illustrates a cross-sectional view of the structure in FIG. 4D following the formation of a dielectric spacer 430 adjacent to the memory device 100. In an embodiment, a dielectric spacer layer is deposited on the memory device 100 and on the uppermost surface 402A of the dielectric 402 as shown. In examples, when $W_{MTJ}$ is less than $W_{CI}$, the dielectric layer may be also deposited on a portion of a top surface of the conductive interconnect 400 (or on a top surface of a cap discussed in association with FIG. 4D). In an embodiment, the dielectric spacer layer is deposited without a vacuum break following the plasma etch process to prevent oxidation of magnetic layers in the memory device 100. In an embodiment, the dielectric spacer layer includes silicon and one or more of nitrogen or carbon. Absence of oxygen in the spacer layer may help minimize oxidation of magnetic layers. In an embodiment, the dielectric spacer layer is etched by a plasma etch process forming dielectric spacer 430 on sidewalls of the memory device 100. In some embodiments, the dielectric spacer 430 includes materials that are similar or substantially similar to the dielectric 402. In such embodiments, portions of the dielectric 402 may be recessed as indicated by dashed lines 432.

The structure of FIG. 4E including the dielectric spacer 430 on sidewalls of the memory device 100 is herein referred to as memory device 450.

Figure 5A:
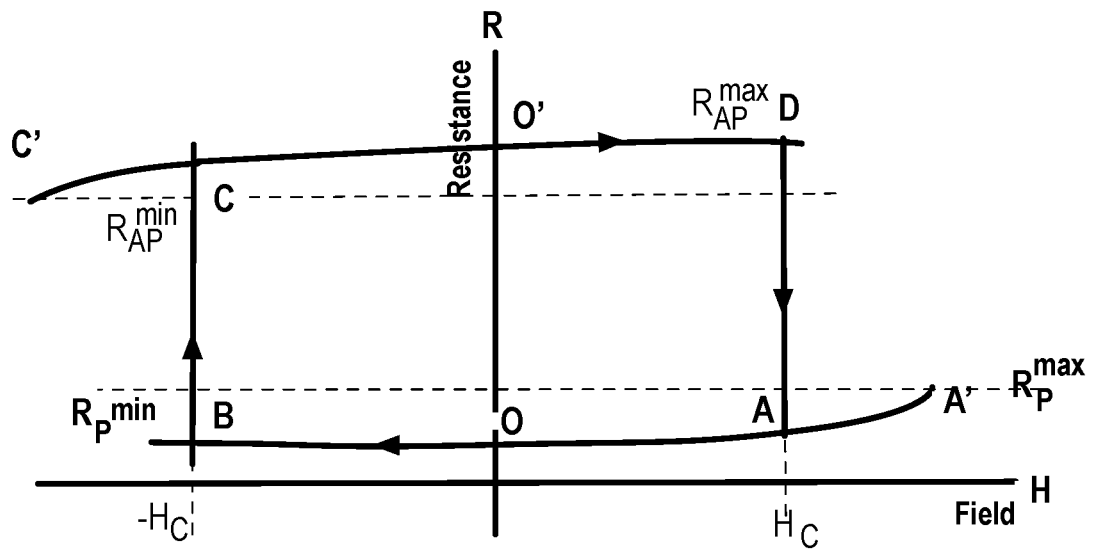
FIG. 5A illustrates a plot of resistance versus magnetic field in a material layer stack for a memory device.

FIG. 5A illustrates a plot of electrical resistance in a memory device (such as a memory device 100 depicted in FIG. 1A) versus an externally applied magnetic field. The plot indicates a change in electrical resistance level in the memory device 100, as the field changes from point A to point B to point C to point D. Corresponding magnetization states in the pinning structure 106, in the fixed magnet 116 and in the free magnet 120 are shown in FIGS. 5B-5F (other structural elements such as electrodes and capping structures are not illustrated for clarity).

Figure 5B:
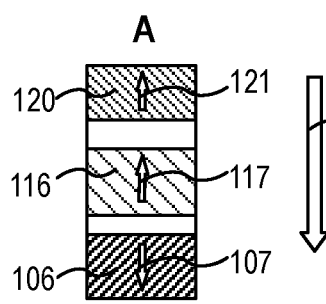
FIG. 5B illustrates magnetizations in various magnetic layers in the material layer stack of FIG. 5A corresponding to a point A on the plot of FIG. 5A.

In an embodiment, at point A, memory device 100 is in a low resistance state (FIG. 5B). Referring to plot in FIG. 5A, as the magnetic field is decreased to 0 at point "0" and then increased in the negative Z- direction, the resistance in memory device 100 increases from approximately $R_P^{max}$ to approximately $R_{AP}^{min}$ (read maximum Parallel resistance to minimum Anti-parallel resistance). There is gradual sloping in resistance in the plot from point A to point B and also between points C and D. However, there is a greater sloping in resistance for fields above $+H_C$ and beyond $-H_C$. It is desirable to reduce resistance sloping within the box ABCD. A measure of the relative slope within box ABCD provides indication of the relative pinning between a pinning structure 106 and fixed magnet 116.

Figure 5C:
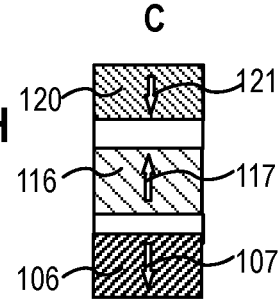
FIG. 5C illustrates magnetizations in various magnetic layers in the material layer stack of FIG. 5A corresponding to a point C on the plot of FIG. 5A.

As the field is increased in magnitude (in reverse direction) from point "O" towards point B, there is a resistance change at point B. The resistance in the memory device 100 increases (point C) due to a change in magnetization 121 in the free magnet 120 of the memory device 100. For a corresponding point C in the plot, the magnetization 121 in free magnet 120 is illustrated in FIG. 5C. The magnetization 121 is antiparallel to magnetization 117 in the fixed magnet 116 at point C.

Figure 5D:
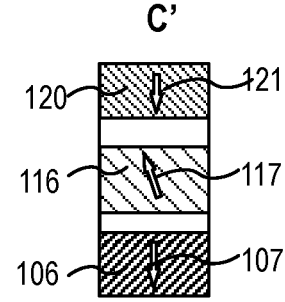
FIG. 5D illustrates magnetizations in various magnetic layers in the material layer stack of FIG. 5A corresponding to a point C' on the plot of FIG. 5A.
Figure 5E:
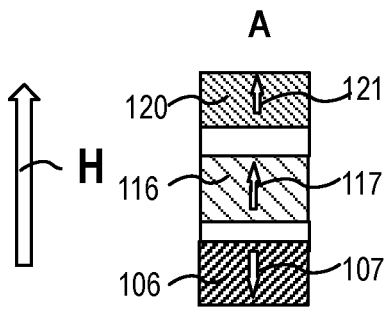
FIG. 5E illustrates magnetizations in various magnetic layers in the material layer stack of FIG. 5A corresponding to a point A on the plot of FIG. 5A.

Referring again to FIG. 5A, if the magnetic field H continues to increase in the negative Z direction (point C to C'), the resistance in memory device 100 decreases relative resistance at point C, as shown in the plot. The resistance decreases from C to C' because the magnetic field may cant the magnetization 117 in the fixed magnet 116 away from the positive Z direction as shown in FIG. 5D.

Referring again to FIG. 5A, as the magnitude of the applied magnetic field is reduced (Point C' to O') the resistance changes slightly as the fixed magnet 116 is stably pinned to the pinning structure 106. When the applied magnetic field is increased in magnitude and directed towards the positive Z direction (Point O' to D), magnetization 121 in the free magnet 120 is influenced. In some embodiments, the resistance changes slightly from point O' to point D. The resistance at point D may be characterized by approximately $R_{AP}^{max}$ (read maximum Parallel resistance).

Figure 5F:
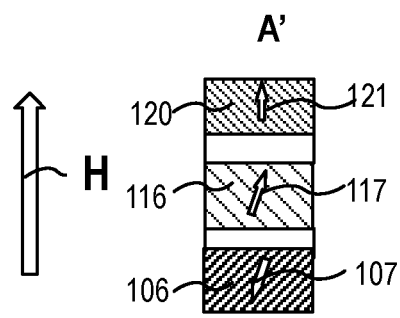
FIG. 5F illustrates magnetizations in various magnetic layers in the material layer stack of FIG. 5A corresponding to a point A' on the plot of FIG. 5A.

At point D, at a critical magnetic field, $H_C$, there is a resistance change in the memory device 100 and the resistance drops to point A. From point D to point A, the magnetization 121 in the free magnet 120 changes from a configuration depicted in FIG. 5C to a configuration depicted in FIG. 5E. The magnetization 121 in the free magnet 120 aligns with the field and points in the positive Z direction as shown. However, if the applied magnetic field strength continues to increase (keeping the field direction the same), the maximum parallel resistance state in the memory device 100 will increase (at high field magnitude). The maximum parallel resistance (low resistance) starts to increase because increasing the magnetic field strength in a direction opposite to the magnetization 111 direction in the pinning structure 106 can cant the magnetization 107 in the pinning structure 106 as shown in FIG. 5F. Canting in the magnetization 107 can influence the magnetization 117 in the fixed magnet 116 because of magnetic coupling between the fixed magnet 116 and the pinning structure 106. When the magnetization 117 is not completely parallel relative to magnetization 121 in free magnet 120, the maximum parallel resistance starts to increase.

The range between the externally applied field (in negative and positive directions) at which canting occurs provides an indication of how well pinned the fixed magnet 116 is relative to the pinning structure 106. If the fixed magnet 116 is not well pinned, canting can occur at lower magnitudes of the magnetic field.

In the plot illustrated in FIG. 5A, the amount of sloping in the resistance levels between $H_C$ and $-H_C$ is less than 1 percent. In an embodiment, the shape of the R-H curve within $H_C$ and $-H_C$ is substantially flat and may be attributed to an iridium conductive layer and preservation of PMA in the pinning structure 106 and in the fixed magnet 116 of the memory device 100. In an embodiment, a difference in resistance between O' and C' in a memory device 100 (including iridium conductive layer) is less compared to a memory device that includes a conductive layer having platinum for example. Similarly, in an embodiment, a difference in resistance between O' and A in a memory device 100 (including iridium conductive layer) is less compared to a memory device that includes a conductive layer having platinum example.

The inventors have found that an operating voltage needed to switch memory device 100 with an iridium conductive layer 102 is lower compared to an operating voltage needed to switch a memory device 100 having a conductive layer including platinum, for example. It is to be appreciated that the canting effect at high external magnetic field (field greater than $H_C$) is a proxy for a different canting effect which takes place during a spin transfer torque switching write operation in absence of an externally applied magnetic field. During device operation, a write operation reverses the magnetization 121 in the free magnet 120 by spin transfer torque effect. In response there is a back torque on the fixed magnet 116 from the free magnet 120. The pinning structure 106 is provided in a memory device 100 to counteract a back-torque effect. If the pinning structure 106 is sufficiently stable, the fixed magnet 116 does not cant (or possibly reverse magnetization direction) due to the back-torque. However, in an absence of a sufficiently stable fixed magnet 116 a greater spin polarized current is required to switch the free magnet 120. Increase in spin polarized current translates to loss of efficiency in device operation as a larger voltage is required to generate a larger spin polarized current (for a given spin polarization).

Figure 6:
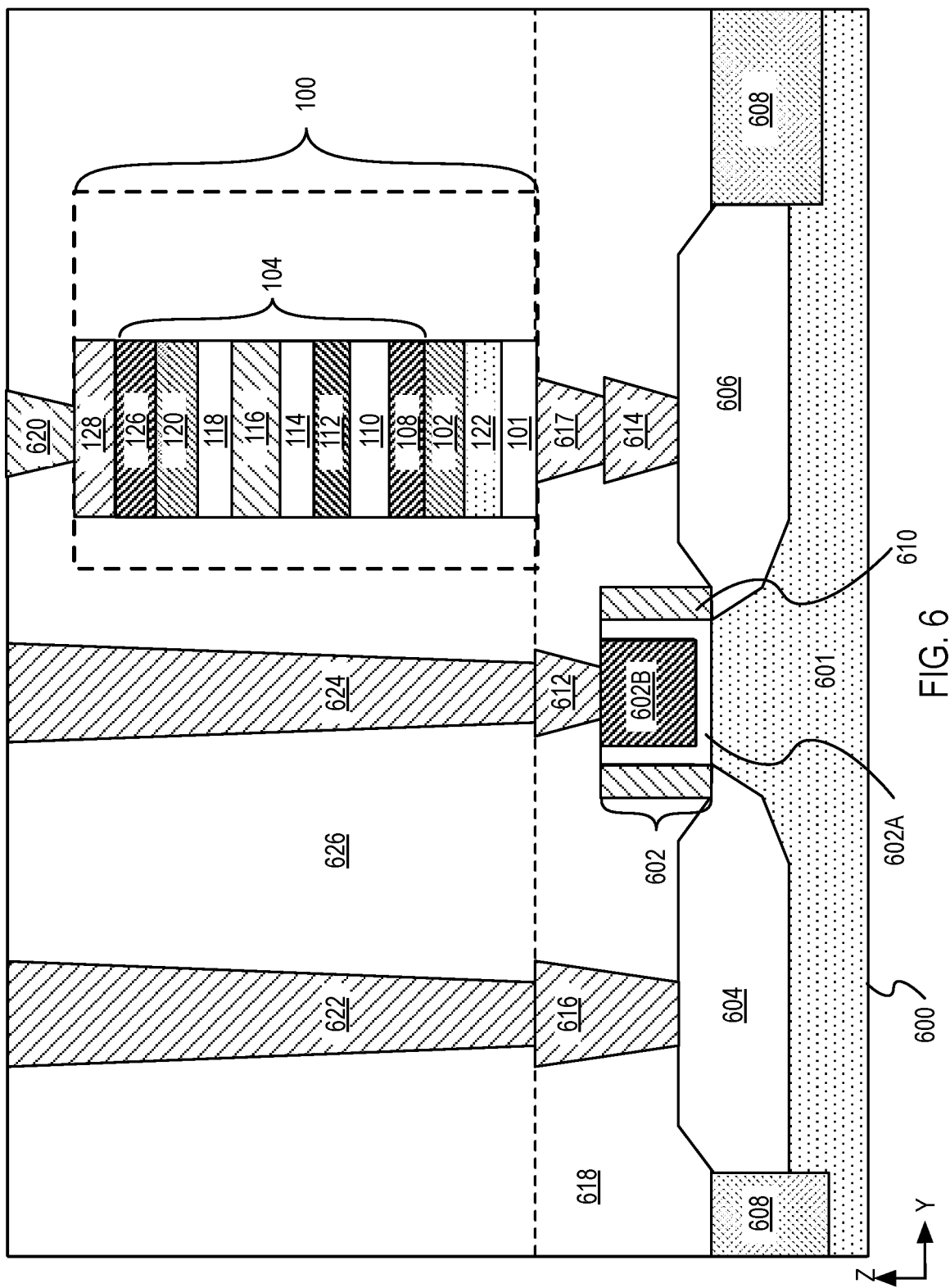
FIG. 6 illustrates a cross-sectional view of a memory device coupled to a transistor.

FIG. 6 illustrates a memory device such as memory device 100 coupled to an access transistor 600. In an embodiment, the transistor 600 is on a substrate 601 and has a gate 602, a source region 604, and a drain region 606. In the illustrative embodiment, an isolation 608 is adjacent to the source region 604, drain region 606 and portions of the substrate 601. In some implementations of the disclosure, such as is shown, a pair of sidewall spacers 610 are on opposing sides of the gate 602.

The transistor 600 further includes a gate contact 612 above and electrically coupled to the gate 602, and a drain contact 614 above and electrically coupled to the drain region 606, and a source contact 616 above and electrically coupled to the source region 604, as is illustrated in FIG. 6. The transistor 600 also includes dielectric 618 adjacent to the gate 602, source region 604, drain region 606, isolation 608, sidewall spacers 610, gate contact 612, drain contact 614 and source contact 616.

In an embodiment, the memory device 100 is a perpendicular memory device 100 with one or more structural and material properties described above in FIG. 1A. The memory device 100 includes electrode 101, a buffer layer 122 on the first electrode 101, a conductive layer 102 including iridium on the buffer layer 122, and magnetic tunnel junction (MTJ) 104 on the conductive layer 102. The MTJ 104 includes magnetic layer 108 including cobalt, non-magnetic layer 110 on the magnetic layer 108, second magnetic layer 112 including cobalt on the magnetic layer 110, a spacer layer 114 on the magnetic layer 112, a fixed magnet 116 on the spacer layer 114, tunnel barrier layer 118 including a metal and oxygen on the fixed magnet 116, magnet 120 on the tunnel barrier 118, a capping structure 126 on the magnet 120 and electrode 128 on the capping structure 126.

An MTJ interconnect 620, is coupled with the electrode 128 as shown. MTJ interconnect 620 may be connected to one or more circuit elements. The memory device is above and coupled with conductive interconnect 617 and adjacent to dielectric 618.

In the illustrative embodiment, the conductive interconnect 617 is on and above with the drain contact 614. In the illustrative embodiment, one portion of the electrode 101 is in electrical contact with a drain contact 614 of transistor 600 through the conductive interconnect 617. In other embodiments, there are one or more additional interconnect structures between drain contact 614 and conductive interconnect 617.

In other embodiments, a perpendicular memory device having one or more features of memory device 150 (described in FIG. 1C) or memory device 160 (described in FIG. 1D) is coupled with the transistor 600.

Gate contact 612 and source contact 616 are each coupled with interconnects. In the illustrative embodiment, gate contact 612 is coupled with a source interconnect 622 and the source contact 616 is coupled with a gate interconnect 624. A dielectric 626 is adjacent to source interconnect 622, gate interconnect 624, memory device 100, source contact 616 and gate contact 612.

In an embodiment, the underlying substrate 601 represents a surface used to manufacture integrated circuits. Suitable substrate 601 includes a material such as single crystal silicon, polycrystalline silicon and silicon on insulator (SOI), as well as substrates formed of other semiconductor materials. In some embodiments, the substrate 601 is the same as or substantially the same as the substrate 130. The substrate 601 may also include semiconductor materials, metals, dielectrics, dopants, and other materials commonly found in semiconductor substrates. In an embodiment, the transistor 600 associated with substrate 601 are metal-oxide-semiconductor field-effect transistors (MOSFET or simply MOS transistors), fabricated on the substrate 601. In some embodiments, the transistor 600 is an access transistor 600. In various implementations of the disclosure, the transistor 600 may be planar transistors, nonplanar transistors, or a combination of both. Nonplanar transistors include FinFET transistors such as double-gate transistors and tri-gate transistors, and wrap-around or all-around gate transistors such as nanori16on and nanowire transistors.

In some embodiments, gate 602 includes at least two layers, a gate dielectric layer 602A and a gate electrode 602B. The gate dielectric layer 602A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 602A to improve its quality when a high-k material is used.

The gate electrode 602B of the access transistor 600 of substrate 601 is formed on the gate dielectric layer 602A and may consist of at least one P-type work function metal or N-type work function metal, depending on whether the transistor is to be a PMOS or an NMOS transistor. In some implementations, the gate electrode 602B may consist of a stack of two or more metal layers, where one or more metal layers are work function metal layers and at least one metal layer is a conductive fill layer.

For a PMOS transistor, metals that may be used for the gate electrode 602B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.6 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.6 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 602B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 602B may consist of one or more U-shaped metal layers formed atop one or more planar, non-U-shaped layers.

The sidewall spacers 610 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 604 and drain region 606 are formed within the substrate adjacent to the gate stack of each MOS transistor. The source region 604 and drain region 606 are generally formed using either an implantation/diffusion process or an etching/deposition process. In the former process, dopants such as boron, aluminum, antimony, phosphorous, or arsenic may be ion-implanted into the substrate to form the source region 604 and drain region 606. An annealing process that activates the dopants and causes them to diffuse further into the substrate typically follows the ion implantation process. In the latter process, the substrate 601 may first be etched to form recesses at the locations of the source and drain regions. An epitaxial deposition process may then be carried out to fill the recesses with material that is used to fabricate the source region 604 and drain region 606. In some implementations, the source region 604 and drain region 606 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 604 and drain region 606 may be formed using one or more alternate semiconductor materials such as germanium or a group III-V material or alloy. And in further embodiments, one or more layers of metal and/or metal alloys may be used to form the source region 604 and drain region 606.

In an embodiment, the source contact 616, the drain contact 614 and gate contact 612 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

In an embodiment, the source interconnect 622 gate interconnect 624, conductive interconnect 617 and MTJ interconnect 620 includes a material that is the same or substantially the same as the material of the conductive interconnect 400 described in association with FIGS. 4A-4E.

The isolation 608 and dielectric 618 and 626 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

In some embodiments, an integrated circuit may include a combination of memory devices 100, 150 or 160 each coupled with a transistor 600.

Figure 7:
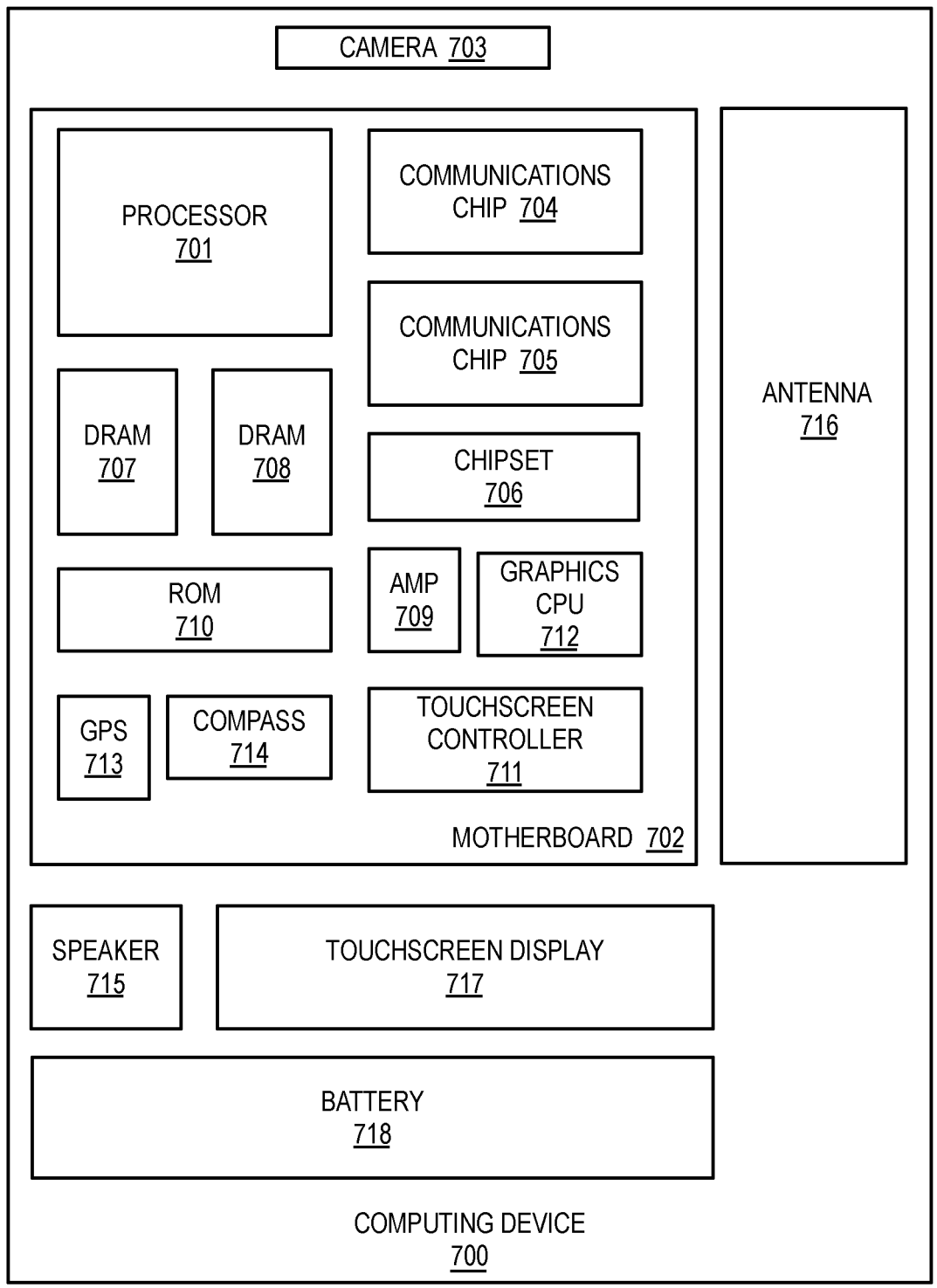
FIG. 7 illustrates a computing device in accordance with embodiments of the present disclosure.

FIG. 7 illustrates a computing device 700 in accordance with embodiments of the present disclosure. As shown, computing device 700 houses a motherboard 702. Motherboard 702 may include a number of components, including but not limited to a processor 701 and at least one communications chip 704 or 705. Processor 701 is physically and electrically coupled to the motherboard 702. In some implementations, communications chip 705 is also physically and electrically coupled to motherboard 702. In further implementations, communications chip 705 is part of processor 701.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset 706, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 705 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 705 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communications chips 704 and 705. For instance, a first communications chip 705 may be dedicated to shorter range wireless communications such as Wi-Fi and Bluetooth and a second communications chip 704 may be dedicated to longer range wireless communications such as GPS, EDGE, GPRS, CDMA, WiMAX, LTE, Ev-DO, and others.

Processor 701 of the computing device 700 includes an integrated circuit die packaged within processor 701. In some embodiments, the integrated circuit die of processor 701 includes one or more transistors, interconnect structures, and non-volatile memory devices such as transistor 600, source interconnect 622, gate interconnect 624, MTJ interconnect 620 and conductive interconnect 400 and memory device 100, respectively (described in FIG. 6). The term "processor" may refer to any device or portion of a device that processes electronic data from registers and/or memory to transform that electronic data into other electronic data that may be stored in registers and/or memory.

Communications chip 705 also includes an integrated circuit die packaged within communication chip 705. In another embodiment, the integrated circuit die of communications chips 704, 705 includes one or more transistors, interconnect structures, and non-volatile memory devices such as transistor 600, source interconnect 622, gate interconnect 624, MTJ interconnect 620 and conductive interconnect 617 and memory device 100, respectively (described in FIG. 6). Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics CPU 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 700 and discussed above may contain a stand-alone integrated circuit memory die that includes one or more arrays of NVM devices including one or more memory devices 100 coupled with transistor 600 (described in FIG. 6).

In various implementations, the computing device 700 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
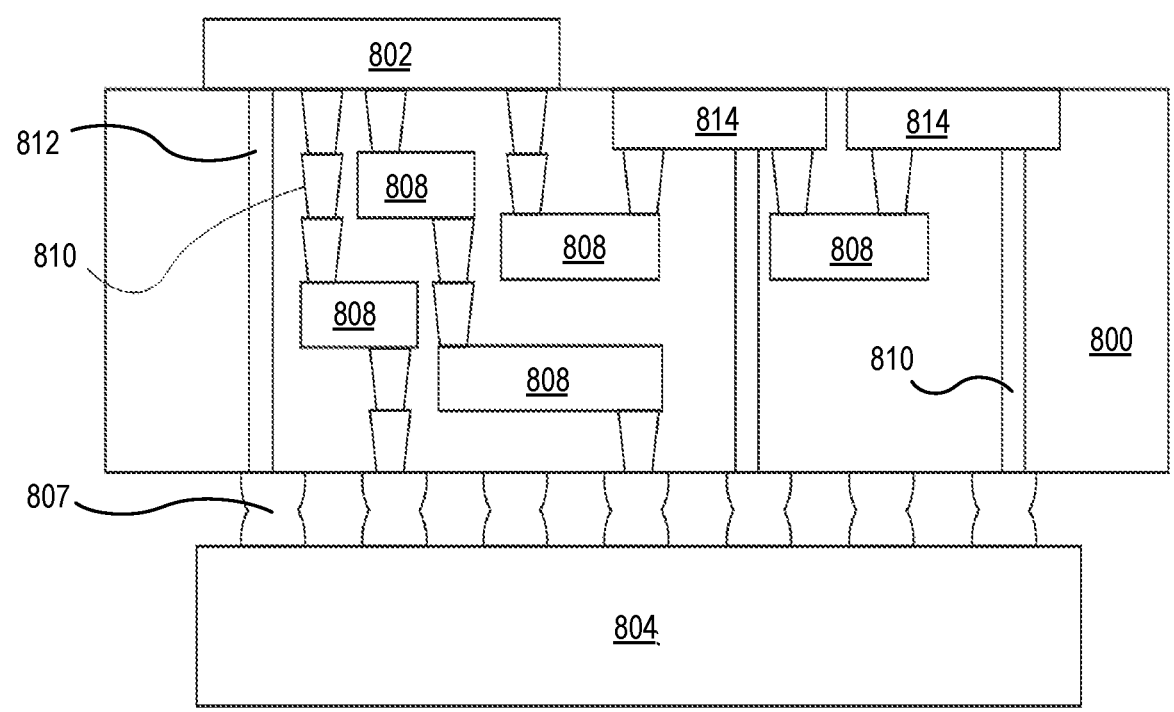
FIG. 8 illustrates an integrated circuit (IC) structure that includes one or more embodiments of the present disclosure.

FIG. 8 illustrates an integrated circuit (IC) structure 800 that includes one or more embodiments of the disclosure. The integrated circuit (IC) structure 800 is an intervening substrate used to bridge a first substrate 802 to a second substrate 804. The first substrate 802 may be, for instance, an integrated circuit die. The second substrate 804 may be, for instance, a memory module, a computer mother, or another integrated circuit die. Generally, the purpose of an integrated circuit (IC) structure 800 is to spread a connection to a wider pitch or to reroute a connection to a different connection. For example, an integrated circuit (IC) structure 800 may couple an integrated circuit die to a ball grid array (BGA) 807 that can subsequently be coupled to the second substrate 804. In some embodiments, the first and second substrates 802/804 are attached to opposing sides of the integrated circuit (IC) structure 800. In other embodiments, the first and second substrates 802/804 are attached to the same side of the integrated circuit (IC) structure 800. And in further embodiments, three or more substrates are interconnected by way of the integrated circuit (IC) structure 800.

The integrated circuit (IC) structure 800 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 808 and vias 810, including but not limited to through-silicon vias (TSVs) 812. The integrated circuit (IC) structure 800 may further include embedded devices 814, including both passive and active devices. Such embedded devices 814 include capacitors, decoupling capacitors, resistors, inductors, fuses, diodes, transformers, device structure including transistors, such as transistor 600 coupled with a with one at least one nonvolatile memory device such as memory device 100 including a conductive layer 102 including iridium (such as described in FIG. 6), in accordance with an embodiment of the present disclosure. The integrated circuit (IC) structure 800 may further include embedded devices 814 such as one or more resistive random-access devices, sensors, and electrostatic discharge (ESD) devices. More complex devices such as radio-frequency (RF) devices, power supplies, power amplifiers, power management devices, antennas, arrays, sensors, and MEMS devices may also be formed on the integrated circuit (IC) structure 800. In accordance with embodiments of the present disclosure, apparatuses or processes disclosed herein may be used in the fabrication of integrated circuit (IC) structure 800.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a perpendicular magnetic tunnel junction-based memory device such as the memory device 100. The memory device 100 may be used in embedded non-volatile memory applications.

Thus, embodiments of the present disclosure include memory devices with and methods of fabrication.

In a first example, a memory device includes a first electrode, a conductive layer including iridium above the first electrode, a magnetic junction on the conductive layer and a second electrode above the magnetic junction. The magnetic junction includes a magnetic structure including a first magnetic layer including cobalt, a non-magnetic layer on the first magnetic layer and a second magnetic layer including cobalt on the non-magnetic layer. The magnetic junction further includes an anti-ferromagnetic layer on the magnet structure, a first magnet with a first magnetization above the anti-ferromagnetic layer, a second magnet with a second magnetization, the second magnet above the first magnet and a layer between the first magnet and the second magnet.

In second examples, for any of the first example, the non-magnetic layer includes platinum or tungsten.

In third examples, for any of the first through second examples, the non-magnetic layer including platinum has a thickness of at least 0.015 nm but less than 0.4 nm.

In fourth examples, for any of the first through third examples, the non-magnetic layer including tungsten has a thickness of at least 0.1 nm but less than 0.4 nm.

In fifth examples, for any of the first through fourth examples, the first magnetic layer has a thickness between 0.4 nm and 2 nm.

In sixth examples, for any of the first through fifth examples, the second magnetic layer has a thickness between 0.4 nm and 2 nm.

In seventh examples, for any of the first through sixth examples, the non-magnetic layer is a first non-magnetic layer and the memory device further includes a second non-magnetic layer on the second magnetic layer and a third magnetic layer on the second non-magnetic layer.

In eighth examples, for any of the first through seventh examples, the second non-magnetic layer includes tungsten, wherein the tungsten has a thickness between 0.1 nm and 0.4 nm.

In ninth examples, for any of the first through eighth examples, the anti-ferromagnetic layer includes ruthenium or iridium.

In tenth examples, for any of the first through ninth examples, the iridium has a thickness of approximately 0.5 nm or 1.4 nm, and wherein the ruthenium has a thickness of approximately 0.4 nm or 0.8 nm.

In eleventh examples, for any of the first through tenth examples, the conductive layer includes up to 1 atomic percent of iron.

In twelfth examples, for any of the first through eleventh examples, the conductive layer has a thickness between 0.5 nm and 5 nm and a face centered cubic <111> crystal texture.

In a thirteenth example, a memory device includes a first electrode, a conductive layer including iridium above the first electrode and a magnetic junction on the conductive layer. The magnetic junction includes a magnetic structure including a first magnetic layer including cobalt, a first non-magnetic layer including platinum on the first magnetic layer, a second magnetic layer including cobalt on the first non-magnetic layer, a second non-magnetic layer including tungsten on the second magnetic layer, and a third magnetic layer on the second non-magnetic layer. The magnetic junction further includes a spacer layer on the first magnet structure, a conductive structure on the spacer layer, a first magnet with a first fixed magnetization above the conductive structure. The magnetic junction further includes a second magnet with a second magnetization, where the second magnet is above the first magnet, a layer between the first magnet and the second magnet. The memory device further includes a second electrode above the magnetic junction.

In fourteenth examples, for any of the thirteenth example, the conductive layer has a thickness between 0.5 nm and 5 nm.

In fifteenth examples, for any of the thirteenth through fourteenth examples, the first magnetic layer has a thickness between 0.4 to 1.5 nm and the second magnetic layer has a thickness between 0.4 nm and 1.5 nm.

In sixteenth examples, for any of the thirteenth through fifteenth examples, the first non-magnetic layer has a thickness of at least 0.015 nm but less than 0.4 nm and the second non-magnetic layer has a thickness between 0.1 nm and 0.4 nm.

In seventeenth examples, for any of the thirteenth through sixteenth examples, the conductive structure includes a fourth magnetic layer including cobalt, wherein the magnetic layer has a thickness between 0.5 nm and 1 nm and a third nonmagnetic layer includes tantalum, molybdenum or tungsten, wherein the third nonmagnetic layer has a thickness of at least 0.1 nm.

In eighteenth examples, for any of the thirteenth through seventeenth examples, the spacer layer includes iridium, wherein the iridium has a thickness of approximately 0.5 nm or approximately 1.4 nm, or spacer layer includes ruthenium, wherein the ruthenium has a thickness of approximately 0.4 nm or approximately 0.8 nm.

In a nineteenth example, a system includes a transistor above a substrate, where the transistor includes a drain contact coupled to a drain, a source contact coupled to a source, a gate contact coupled to a gate and a bottom electrode coupled to the drain contact. The system further includes a memory device, coupled with the drain contact. The memory device includes a first electrode, a buffer layer on the first electrode, a conductive layer including iridium above the first electrode and a magnetic tunnel junction (MTJ) on the conductive layer. The magnetic junction further includes a magnetic structure including a magnetic layer including cobalt, an anti-ferromagnetic layer on the magnetic layer, a first magnet with a first magnetization above the anti-ferromagnetic layer, a second magnet with a second magnetization, the second magnet above the first magnet and a tunnel barrier between the first magnet and the second magnet and a second electrode on the MTJ.

In twentieth examples, for any of the nineteenth example, further including a power supply coupled to the transistor, wherein the first and second magnetizations are perpendicular to a plane of the memory device.

What is claimed is:

1. A memory device, comprising:
   a first electrode;
   a conductive layer comprising iridium and iron above the first electrode, wherein the conductive layer is a single conductive layer, wherein the conductive layer comprises up to 1 atomic percent of iron and wherein the atomic percent of iron varies from an uppermost surface to a lowermost surface of the conductive layer;
   a magnetic junction on the conductive layer, the magnetic junction comprising:
      a magnetic structure, comprising:
         a first magnetic layer comprising cobalt;
         a non-magnetic layer on the first magnetic layer; and
         a second magnetic layer comprising cobalt, the second magnetic layer on the non-magnetic layer, wherein the magnetic structure has antiferromagnetic properties;
      an anti-ferromagnetic layer on the magnet structure;
      a first magnet with a first magnetization, the first magnet above the anti-ferromagnetic layer, wherein the first magnetization is a fixed magnetization;
      a second magnet with a second magnetization, the second magnet above the first magnet, wherein the second magnetization is a free magnetization;
      a layer between the first magnet and the second magnet; and
   a second electrode above the magnetic junction.

2. The memory device of claim 1, wherein the non-magnetic layer comprises platinum or tungsten.

3. The memory device of claim 2, wherein the non-magnetic layer comprising platinum has a thickness of at least 0.015 nm but less than 0.4 nm.

4. The memory device of claim 2, wherein the non-magnetic layer comprising tungsten has a thickness of at least 0.01 nm but less than 0.4 nm.

5. The memory device of claim 1, wherein the first magnetic layer has a thickness between 0.4 nm and 2 nm.

6. The memory device of claim 1, wherein the second magnetic layer has a thickness between 0.4 nm and 2 nm.

7. The memory device of claim 1, wherein the non-magnetic layer is a first non-magnetic layer and the memory device further comprises:
 a second non-magnetic layer on the second magnetic layer; and
 a third magnetic layer on the second non-magnetic layer.

8. The memory device of claim 7, wherein the second non-magnetic layer comprises tungsten, wherein the tungsten has a thickness between 0.1 nm and 0.4 nm.

9. The memory device of claim 1, wherein the anti-ferromagnetic layer comprises ruthenium or iridium.

10. The memory device of claim 9, wherein the iridium has a thickness of approximately 0.5 nm or approximately 1.4 nm, and wherein the ruthenium has a thickness of approximately 0.4 nm or approximately 0.8 nm.

11. The memory device of claim 1, wherein the conductive layer comprises cobalt, wherein the atomic percent of cobalt varies from an uppermost surface to a lowermost surface of the conductive layer, and wherein a concentration of cobalt varies by up to 1% where a high concentration is at an uppermost surface and a low concentration is at a lowermost surface.

12. The memory device of claim 1, wherein the conductive layer has a thickness between 0.5 nm and 5 nm and a face centered cubic <111>crystal texture.

13. A memory device, comprising:
 a first electrode;
 a conductive layer comprising iridium and iron above the first electrode, wherein the conductive layer is a single conductive layer, wherein the conductive layer comprises up to 1 atomic percent of iron and wherein the atomic percent of iron varies from an uppermost surface to a lowermost surface of the conductive layer;
 a magnetic junction on the conductive layer, the magnetic junction comprising:
  a magnetic structure comprising:
   a first magnetic layer comprising cobalt;
   a first non-magnetic layer comprising platinum on the first magnetic layer;
   a second magnetic layer comprising cobalt, the second magnetic layer on the first non-magnetic layer;
   a second non-magnetic layer comprising tungsten, the second non-magnetic layer on the second magnetic layer; and
   a third magnetic layer on the second non-magnetic layer;
  a spacer layer on the first magnet structure;
  a conductive structure on the spacer layer;
  a first magnet with a first magnetization above the conductive structure,
   wherein the first magnetization is a fixed magnetization;
  a second magnet with a second magnetization, the second magnet above the first magnet, wherein the second magnetization is a free magnetization;
  a layer between the first magnet and the second magnet; and
 a second electrode above the magnetic junction.

14. The memory device of claim 13, wherein the conductive layer has a thickness between 0.5 nm and 5 nm.

15. The memory device of claim 13, wherein the first magnetic layer has a thickness between 0.4 to 1.5 nm and the second magnetic layer has a thickness between 0.4 nm and 1.5 nm.

16. The memory device of claim 13, wherein the first non-magnetic layer has a thickness of at least 0.015 nm but less than 0.4 nm and the second non-magnetic layer has a thickness between 0.1 nm and 0.4 nm.

17. The memory device of claim 13, wherein the conductive structure comprises:
 a fourth magnetic layer comprising cobalt, wherein the magnetic layer has a thickness between 0.5 nm and 1 nm; and
 a third nonmagnetic layer includes tantalum, molybdenum or tungsten, wherein the third nonmagnetic layer has a thickness of at least 0.1 nm.

18. The memory device of claim 13, wherein the spacer layer comprises iridium, wherein the iridium has a thickness of approximately 0.5 nm or approximately 1.4 nm, or spacer layer comprises ruthenium, wherein the ruthenium has a thickness of approximately 0.4 nm or approximately 0.8 nm.

19. A system, comprising:
 a transistor above a substrate, the transistor comprising:
  a drain contact coupled to a drain;
  a source contact coupled to a source;
  a gate contact coupled to a gate; and
  a bottom electrode coupled to the drain contact;
 a memory device, coupled with the drain contact, the memory device comprising:
  a first electrode;
  a buffer layer on the first electrode;
  a conductive layer comprising iridium and iron above the first electrode, wherein the conductive layer is a single conductive layer, wherein the conductive layer comprises up to 1 atomic percent of iron and wherein the atomic percent of iron varies from an uppermost surface to a lowermost surface of the conductive layer;
  a magnetic tunnel junction (MTJ) on the conductive layer, the MTJ comprising:
   a magnetic structure comprising:
    a first magnetic layer comprising cobalt;
    a non-magnetic layer on the first magnetic layer; and
    a second magnetic layer comprising cobalt, the second magnetic layer on the non-magnetic layer, wherein the magnetic structure has antiferromagnetic properties;
   an anti-ferromagnetic layer on the magnetic layer;
   a first magnet with a first magnetization, the first magnet is above the anti-ferromagnetic layer, wherein the first magnetization is a fixed magnetization;
   a second magnet with a second magnetization, the second magnet above the first magnet, wherein the second magnetization is a free magnetization;
   a tunnel barrier between the first magnet and the second magnet; and
  a second electrode on the MTJ.

20. The system of claim 19, further comprising a power supply coupled to the transistor, wherein the first and second magnetizations are perpendicular to a plane of the memory device.

* * * * *